(12) United States Patent
Visvardis et al.

(10) Patent No.: US 12,307,180 B1
(45) Date of Patent: *May 20, 2025

(54) CAPACITANCE EXTRACTION SYSTEMS BASED ON MACHINE LEARNING MODELS

(71) Applicant: ANSYS, INC., Canonsburg, PA (US)

(72) Inventors: Marios Visvardis, Athens (GR); Periklis Liaskovitis, Athens (GR); Efthymios Efstathiou, Athens (GR)

(73) Assignee: ANSYS, INC., Canonsburg, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/221,370

(22) Filed: Jul. 12, 2023

Related U.S. Application Data

(63) Continuation of application No. 17/215,395, filed on Mar. 29, 2021, now Pat. No. 11,741,283.

(51) Int. Cl.
| | |
|---|---|
| *G06F 30/337* | (2020.01) |
| *G06F 17/17* | (2006.01) |
| *G06F 30/3308* | (2020.01) |
| *G06N 3/08* | (2023.01) |
| *G06N 7/01* | (2023.01) |

(52) U.S. Cl.
CPC ............ *G06F 30/337* (2020.01); *G06F 17/17* (2013.01); *G06F 30/3308* (2020.01); *G06N 3/08* (2013.01); *G06N 7/01* (2023.01)

(58) Field of Classification Search
CPC .... G06F 30/337; G06F 17/17; G06F 30/3308; G06F 30/367; G06N 3/08; G06N 7/01; G06N 3/0455; G06N 3/0464; G06N 3/084

See application file for complete search history.

(56) References Cited

U.S. PATENT DOCUMENTS

| | | | |
|---|---|---|---|
| 6,735,748 B1 | 5/2004 | Teig | |
| 6,892,366 B1 * | 5/2005 | Teig | G06F 30/367 716/115 |

(Continued)

OTHER PUBLICATIONS

Le Coz et al., "A Stochastic Algorithm for High Speed Capacitance Extraction in Integrated Circuits," Solid-State Electronics, vol. 35, No. 7, pp. 1005-1012, 1992.

(Continued)

*Primary Examiner* — Nghia M Doan

(57) ABSTRACT

Extraction of capacitance values from a design of an electrical circuit can use a set of trained neural networks to generate extracted capacitance values from the circuit using a representation of the Green's function. A method can include the following operations: storing a machine learning model that includes a trained set of one or more neural networks that have been trained to calculate a representation of a Green's function to extract capacitance values from a design of a circuit having a set of conductors; applying, to the machine learning model, a set of inputs representing the set of conductors and their surrounding dielectric materials; encoding the set of inputs through a trained encoder to generate a latent space representation; calculating the values of the Green's function from the latent space representation through a dedicated trained neural network; and calculating the values of the gradient of the Green's function from the latent space representation through another dedicated trained neural network.

22 Claims, 17 Drawing Sheets

(56) References Cited

U.S. PATENT DOCUMENTS

| | | | |
|---|---|---|---|
| 7,720,651 | B2 | 5/2010 | Canning |
| 8,082,130 | B2 | 12/2011 | Guo |
| 10,013,522 | B2 | 7/2018 | Visvardis |
| 10,274,533 | B1 | 4/2019 | Visvardis |
| 11,741,283 | B1* | 8/2023 | Visvardis ............... G06N 3/084 716/100 |
| 2005/0251378 | A1* | 11/2005 | Zhao .................... G06F 30/367 703/14 |
| 2021/0133539 | A1* | 5/2021 | Srivastava ............ G06N 3/047 |

OTHER PUBLICATIONS

Batterywala et al., "Variance Reduction in Monte Carlo Capacitance Extraction," in Proceedings of 18th International Conference on VLSI Design. IEEE, 2005, pp. 85-90.

Zhang et al., "Efficient Space Management Techniques for Large-Scale Interconnect Capacitance Extraction With Floating Random Walks," IEEE Transactions on Computer-Aided Design of Integrated Circuits and Systems, vol. 32, No. 10, pp. 1633-1637, 2013.

Zhang et al., "Efficient Techniques for the Capacitance Extraction of Chip-Scale VLSI Interconnects Using Floating Random Walk Algorithm," in 2014 19th Asia and South Pacific Design Automation Conference (ASP-DAC), 2014, pp. 756-761.

Yu et al., "RWCap: A Floating Random Walk Solver for 3-D Capacitance Extraction of Very-Large-Scale Integration Interconnects," IEEE Transactions on Computer-Aided Design of Integrated Circuits and Systems, vol. 32, No. 3, pp. 353-366, 2013.

Zhuang et al., "Fast Floating Random Walk Algorithm for Multi-Dielectric Capacitance Extraction with Numerical Characterization of Green's Functions," in IEEE Asia and South Pacific Design Automation Conference (ASP-DAG), 2012, pp. 377-382.

Yu, "RWCap2: Advanced Floating Random Walk Solver for the Capacitance Extraction of VLSI Interconnects," in ASICON, 2013, pp. 162-165.

Desai et al., "An efficient capacitance extractor using floating random walks," Ph.D. dissertation, Indian Institute of Technology, 1998, 24 pages.

Rollins, "SESS Rapid3D 20X Performance Improvement," Synopsys, Tech. Rep., 2010, 36 pages.

Zhang et al., "Improved pre-characterization method for the random walk based capacitance extraction of multi-dielectric VLSI interconnects," International Journal of Numerical Modelling: Electronic Networks, Devices and Fields, vol. 29, Jan. 2015, 14 pages.

Yang et al., "Reliable Macromodel Generation for the Capacitance Extraction Based on Macromodel-Aware Random Walk Algorithm," IEEE Transactions on Computer-Aided Design of Integrated Circuits and Systems, vol. 39, No. 4, pp. 946-951, 2019, 6 pages.

Yu et al., "Capacitance Extraction and Power Grid Analysis Using Statistical and AI Methods," in 2020 25th Asia and South Pacific Design Automation Conference (ASP-DAG), 2020, pp. 428-433.

Ei-Moselhy et al., "A Markov Chain Based Hierarchical Algorithm for Fabric-Aware Capacitance Extraction," IEEE Transactions on Advanced Packaging, vol. 33, No. 4, pp. 818-827, 2010.

Dengi et al., "Boundary Element Method Macromodels for 2-D Hierarchical Capacitance Extraction," in Proceedings 1998 Design and Automation Conference. 35th DAC. (Cat. No.98CH36175), 1998, pp. 218-223.

Hornik, K., "Approximation Capabilities of Multilayer Feedforward Networks," Neural Networks, vol. 4, pp. 251-257, 1991.

Lecun, et al., "Deep learning," Nature, vol. 521, pp. 436-444, May 2015.

Bengio et al., Convolutional Networks for Images, Speech, and Time Series. Cambridge, MA, USA: MIT Press, 1998, pp. 255-258.

Simonyan et al., "Very Deep Convolutional Networks For Large-Scale Image Recognition," arXiv 1409.1556, Sep. 2014.

Cohen et al., "Group Equivariant Convolutional Networks," CoRR, vol. abs/1602.07576, 2016. [Online]. Available: http://arxiv.org/abs/1602.07576.

Worrall et al., "Cubenet: Equivariance to 3D Rotation and Translation," CoRR, vol. abs/1804.04458, 2018. [Online]. Available: http://arxiv.org/abs/1804.04458.

Hinton et al., "Reducing the Dimensionality of Data with Neural Networks," Science, vol. 313, No. 5786, pp. 504-507, 2006. [Online]. Available: https://science.sciencemag.org/content/313/5786/504.

Springenberg et al., "Striving for Simplicity: The All Convolutional Net," Dec. 2014.

Zeiler et al., "Deconvolutional Networks," in 2010 IEEE Computer Society Conference on Computer Vision and Pattern Recognition, 2010, pp. 2528-2535.

C. M. Bishop, Mixture Density Networks, Tech. Rep., 1994.

Non-Final Office Action from U.S. Appl. No. 17/215,395 mailed Oct. 25, 2022, 11 pages.

Notice of Allowance from U.S. Appl. No. 17/215,395 mailed Apr. 14, 2023, 8 pages.

* cited by examiner

CAPACITANCE EXTRACTION SYSTEMS BASED ON MACHINE LEARNING MODELS

CROSS-REFERENCE TO RELATED APPLICATION

The present application is a continuation application and claims priority to U.S. application Ser. No. 17/215,395, filed Mar. 29, 2021, entitled "CAPACITANCE EXTRACTION SYSTEMS BASED ON MACHINE LEARNING MODELS," which is hereby incorporated by reference.

BACKGROUND

This disclosure relates to the field of systems and methods for designing electrical circuits, and in particular this disclosure relates to the field of simulations of the design of a circuit to determine or extract capacitance values, such as parasitic capacitance values in an electrical circuit.

Modern silicon fabrication processes and high frequency chip-scale designs pose elevated capacitance parasitics modeling challenges. For the purpose of capacitance extraction, random walk based extractors have steadily gained popularity over the years and are now broadly used in production. Among their merits are a low memory footprint, potential for massive parallelization and tunable accuracy.

A fundamental component of modern random-walk based extraction is accurate and efficient calculation of the Green's function inside transition domains. Transition domains are essentially the machinery employed by the random walk to advance ("transition") within the overall design space. Such transition domains typically contain arbitrary combinations of planar dielectrics. Moreover, effective handling of non-planar dielectric setups, such as those occurring due to advanced layout-dependent effects, also becomes increasingly important in the silicon industry.

Although existing Green's function approximation methods, such as the precomputation methods described in U.S. Pat. No. 10,274,533, can handle the above requirements in a uniform, heuristic manner, they do so at the expense of accuracy. The cardinal difficulty of such methods lies in the fact that no amount of precomputation can adequately address all dielectric configurations that could be encountered, beforehand: the parameter space is simply too large. Therefore, any precomputation scheme will inevitably have to resort to hand-crafted heuristics, unless it can exploit its past experience to adapt to previously unseen extraction setups. Ideally, the mechanism of this adaptation should itself be entirely data driven and not hand-crafted.

Non-planar dielectrics pose another difficulty for existing capacitance extraction techniques. Many existing techniques cannot adequately handle capacitance extraction from designs that include non-planar dielectrics, and non-planar dielectrics are becoming important in modern semiconductor designs.

SUMMARY OF THE DESCRIPTION

The random walk algorithm for extraction of capacitance values from a design of an electrical circuit can use a set of trained neural networks to drive the extraction of capacitance values through a learned representation of the Green's function. This disclosure describes several embodiments that can extract capacitance values from a design of an electrical circuit using a set of trained neural networks, such as deep convolutional neural networks. This disclosure describes the training and use of these neural networks which represent a form of deep learning models or machine learning models.

A method in one embodiment can include the following operations to use a trained set of neural networks: storing a machine learning model that includes a trained set of one or more neural networks that have been trained to calculate a representation of a Green's function in the context of the random walk algorithm for extraction of capacitance values from a design of a circuit having a set of conductors; applying, to the machine learning model, a set of inputs representing the set of conductors and their surrounding dielectric materials; encoding the set of inputs through a trained encoder to generate a latent space representation; calculating the values of the Green's function from the latent space representation through a dedicated trained neural network; and calculating the values of the gradient of the Green's function from the latent space representation through another dedicated trained neural network. Both the values of the Green's function and the values of the gradient of the Green's function can be calculated by the respective trained neural networks during a random walk among the set of conductors. In one embodiment, the trained encoder encodes characteristics of dielectric permittivity values within volumes inside the design, and the latent space representation is equivariant to rotation of these volumes. In one embodiment, the neural network for calculation of the values of the gradient of the Green's function is trained for a first axis that is also used for gradient computations in a second axis and a third axis after transformations for the second axis and the third axis, in order to reduce a size of the machine learning model. In one embodiment, the trained set of neural networks comprises a first face decoder that generates a Green's function output for a first face of a volume, and the first face decoder is used with a set of transformations of the latent space representation to generate a set of Green's function outputs for a second face, a third face, a fourth face, a fifth face, and a sixth face of the volume such as a transition cube used in the random walk.

In one embodiment, the representation of the Green's function is a Gaussian mixture model that approximates the Green's function for a selected face of a transition volume, and a trained mixture density neural network in the trained set of neural networks infers parameters of the Gaussian mixture model to approximate the Green's function on the selected face. In one embodiment, the inferred parameters of the Gaussian mixture model are used to derive an approximate output of the Green's function for the selected face. In one embodiment, a trained face selector neural network receives the latent space representation and generates a face distribution from which a face is selected, and the latent space representation is transformed based on the selected face and applied as an input to the trained mixture density neural network. In one embodiment, the gradient output is calculated only once over a path of the random walk.

A method in one embodiment can include the following operations to train a set of neural networks that can facilitate extraction of capacitance values using a random-walk algorithm: training an encoder to generate encoded outputs, in latent space, from inputs representing a training set of conductors and their surrounding dielectric materials in a set of one or more training circuits; training a set of neural networks to calculate the values of the Green's function and the values of the gradient of the Green's function necessary to extract capacitance values from conductors in the set of one or more training circuits; and storing a machine learning model that includes the trained encoder and the trained set of decoder neural networks. The values of the Green's function and the values of the gradient of the Green's function are generated at inference time of the trained system in one embodiment, during a random walk among a set of conductors in a circuit. The training can be supervised by a Green's function solver that provides valid solutions and a discriminator that provides loss function values to adjust weights in the set of neural networks. The Domain Encoder, which is responsible for generating the latent space representation is trained using an autoencoder network. In one embodiment, the trained encoder encodes dielectric permittivity values within volumes in the circuit during the random walk, and a latent space representation from the trained encoder is equivariant to rotation of these volumes. In one embodiment, the trained set of neural network includes a neural network for calculation of the values of the gradient of the Green's function which is trained for a first axis that is also used for gradient computations in a second axis and a third axis after transformations for the second axis and the third axis, in order to reduce a size of the machine learning model. In one embodiment, the trained set of neural networks comprises a first face decoder that generates a Green's function output for a first face of a volume, and the first face decoder is used with a set of transformations of the latent space representation to generate a set of Green's function outputs for a second face, a third face, a fourth face, a fifth face, and a sixth face of the volume.

In one embodiment, a data processing system can be configured by software to train and create a system that can extract capacitance values using the embodiments described herein, and this system can be referred to as a simulation system that simulated the design of the circuit (e.g., an integrated circuit (IC)). The embodiments include enhanced systems that can use less memory at run time of the extraction and in model size (in persistent storage when not running). For example, a trained neural network re-uses subnets (e.g., the gradient decoder x is also used for gradient decoder y and gradient decoder z) by using a transformation function that reduces model size, and the Green's function decoder is reused for all faces of the transition cube. A further enhanced trained model computes the gradient of the Green's function only once (at the first transition of each random walk), and also uses a Gaussian Mixture Model (GMM) to approximate the Green's function which reduces the required nodes in a mixture density neural network that is trained to infer the parameters of the GMM. These enhancements can also reduce computational load and therefore reduce the amount of time required to generate extracted solutions using the trained system.

In another embodiment, a method may use a general machine learning model which may not use neural networks. In this embodiment, the method can include the following operations: storing a machine learning model that has been trained to represent a Green's function to extract capacitance values using a random walk based method for a design of a circuit having a set of conductors surrounded by dielectric materials present within volumes inside the design of the circuit; applying, to the machine learning model, a set of inputs representing the dielectric materials; generating a representation of the Green's function and a gradient of the Green's function based on the set of inputs applied to the machine learning model; and calculating the capacitance values for the design of the circuit using the random walk based method according to the representation of the Green's function and the gradient of the Green's function, wherein the representation of the Green's function is used to randomly pick samples on transition volumes for the random walk based method.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in dynamic random access memory (DRAM) which is volatile memory or in nonvolatile memory, such as flash memory or other forms of memory. The aspects and embodiments described herein can also be in the form of data processing systems that are built or programmed to perform these methods. For example, a data processing system can be built with hardware logic to perform these methods or can be programmed with a computer program to perform these methods and such a data processing system can be considered a simulation system that can extract capacitance values from a design of a circuit such as an IC.

The above summary does not include an exhaustive list of all embodiments and aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described, in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

Figure 1:
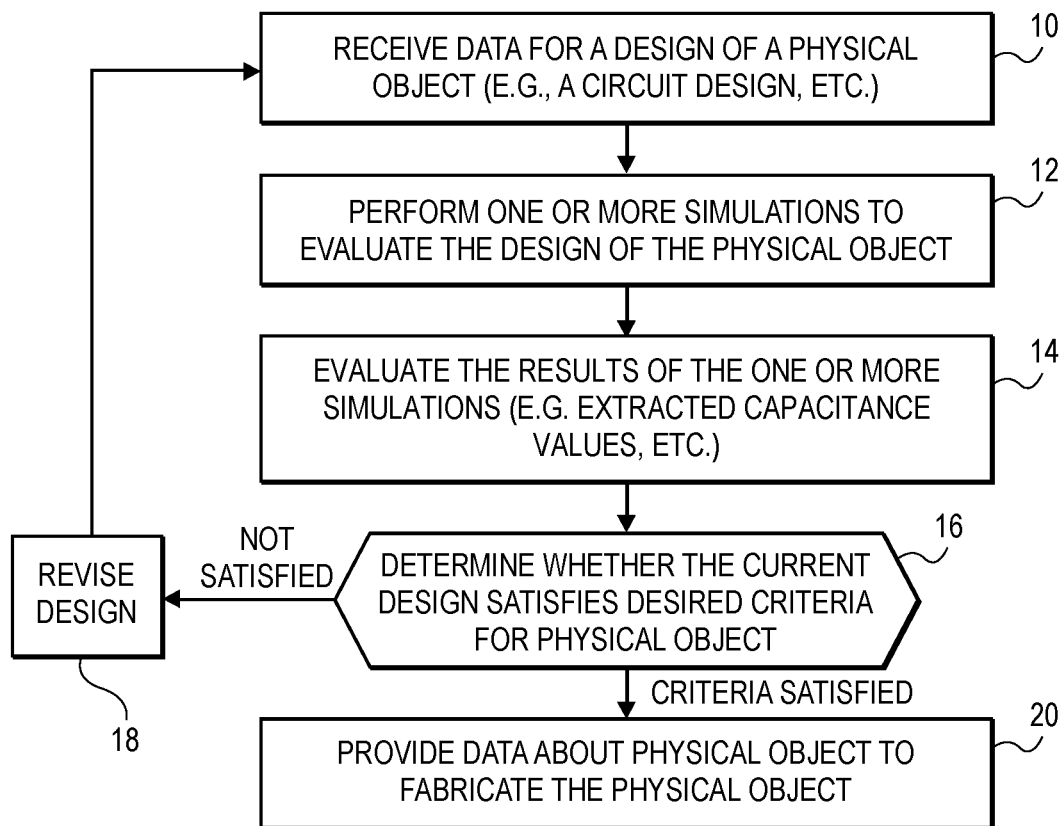
FIG. 1 is a flowchart which illustrates a method which can be used according to one or more embodiments described herein to design an integrated circuit (IC) and simulate the properties (e.g., parasitic capacitance values) of the system prior to fabricating the IC.

The embodiments described herein can be used in simulations of electrical circuits (for example, an IC) in order to determine whether a particular design of the IC satisfies particular requirements for the circuit or system containing the circuit. For example, there might be certain design requirements relating to parasitic capacitance for a power distribution network or other portions in the IC. FIG. 1 shows a method in which these design requirements can be tested relative to a particular design of an IC which is being simulated. In operation 10 of FIG. 1, a data processing system (e.g., a computer executing simulation software to provide a simulation system) can receive data about a design for a particular IC package or other electrical circuit. The data can be created in CAD software on a data processing system, and the data can include information about the geometry of the IC, pins and nets in the IC and information about the materials in the conductors and dielectrics (e.g., silicon dioxide, etc), etc. Then in operation 12, the data processing system can perform one or more simulations (such as simulations based on physical models of the IC package and PCB) to evaluate the design of the IC by determining, for example, parasitic capacitance values in the IC. These simulations can use the aspects and embodiments described herein. In one embodiment, the data processing system can perform simulations using a random walk algorithm which converges upon a solution that specifies extracted parasitic capacitance values in the IC in the simulation. This random walk algorithm can be driven by a set of trained neural networks. In operation 14, the designer can evaluate the results of one or more simulations to determine whether the design of the IC satisfies certain desired criteria for the design. This determination is shown in operation 16. If the one or more criteria is satisfied, then the designer in operation 20 can provide data about the circuit to allow the fabrication or manufacture of the IC or system. For example, if the one or more criteria are satisfied, a CAD file can be produced that describes how to build the IC or system. If the criteria are not satisfied as determined in operation 16, the designer can revise the design in operation 18 (for example, by changing sizes and/or quantity of the power distribution network in the IC or moving conductors in the design, etc.) and repeat the process by performing additional further simulations to evaluate the redesigned circuit. This can be repeated until the desired criteria are achieved for the circuit.

Figure 2A:
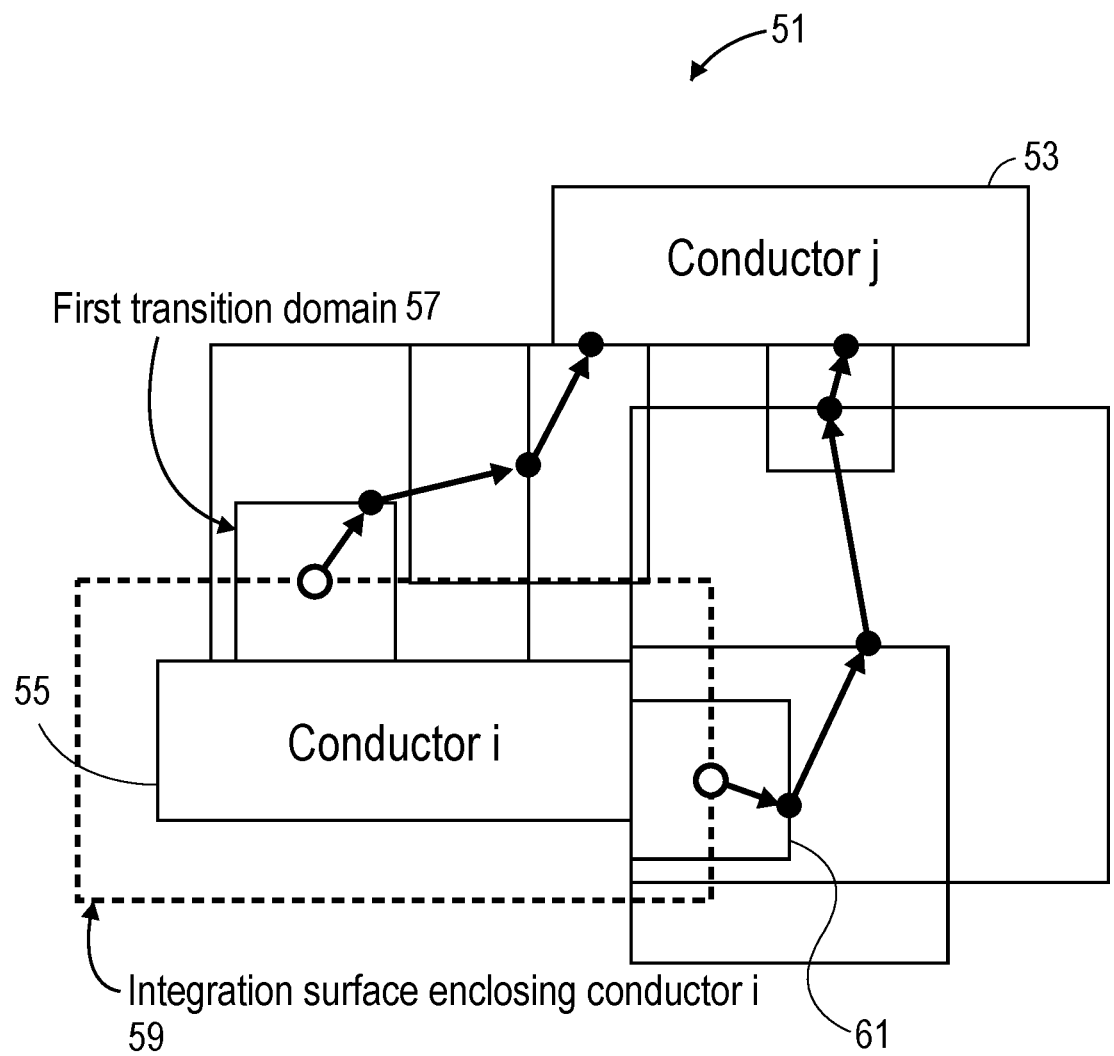
FIG. 2A shows an example of a floating random walk during a capacitance extraction method according to one or more embodiments; in this example, two walks are launched from the integration surface around conductor i and land on the surface of conductor j.

FIG. 2A shows an example of a floating random walk 51 that can be used with a trained system described herein. In this example, two walks are launched from the integration surface (Integration surface 59) around conductor i (conductor 55) and land on the surface of conductor j (conductor 53). There may be multiple different dielectrics around each of conductor i and j. As shown in FIG. 2A, the walk with 3 hops includes a first transition domain 57, and the walk with four hops includes a first transition domain 61. The transition domain is a cube in space in the simulated design. Further background information about floating random walks and methods for computing and using Green's function is provided in U.S. Pat. No. 10,274,533 (by inventors Marios Visvardis, Errikos Lourandakis, and Stefanos Stefanou) which is hereby incorporated herein by reference. U.S. Pat. No. 10,013,522 (by inventors Marios Visvardis, Errikos Lourandakis, and Stefanos Stefanou) also provides further background information about the computation and use of the Green's function and is also hereby incorporated herein by reference.

Figure 2B:
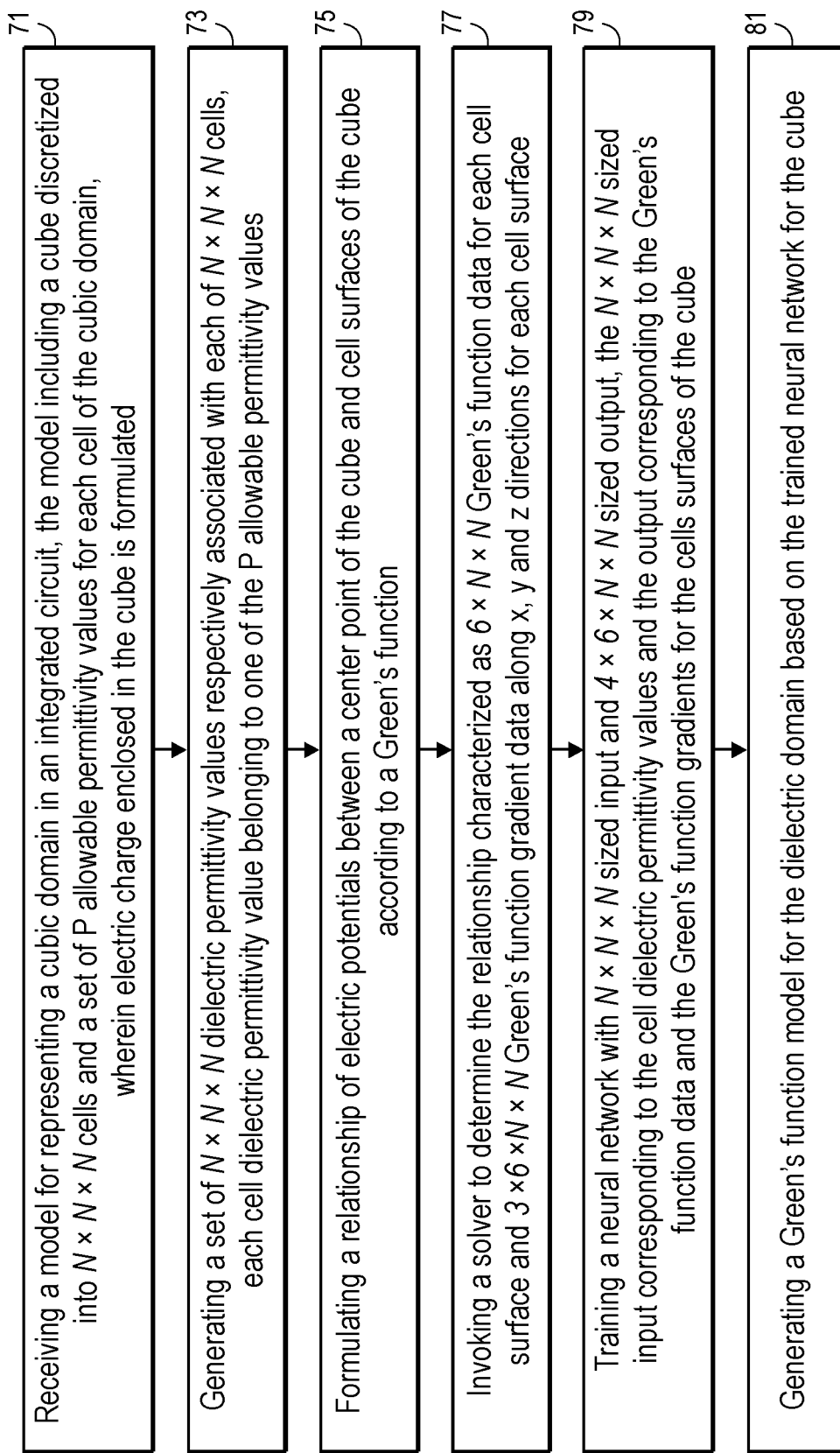
FIG. 2B shows an example of a method of training a set of neural networks according to one embodiment.

Given a configuration of dielectrics enclosed by a 3D cube (or other three dimensional volumes), the system in one embodiment is trained to, as closely as possible in one embodiment, approximate the resulting Green's function and its gradient on the surface of the cube. Training, for example as shown in FIG. 2B, happens in a supervised manner, i.e., by progressively optimizing the output of the system against ground truth Green's function values found through independent means, e.g., through a finite difference method (FDM) solver. At test or inference time, the system is presented with 3D cubes enclosing new, arbitrary combinations of dielectric mediums, particularly ones that were not seen during training. The system should be trained on enough data, but also be regularized enough to be able to accurately generalize on these previously unseen dielectric configurations. The specific machine learning system used in the embodiments described herein can be a deep neural network model, such as a set of deep convolutional neural networks.

The deep neural network (DNN) can be trained with synthetic examples, which can be generated using an FDM solver. The solver is able to calculate the Green's function for a cube, whose volume is discretized into N×N×N cells. Each interior cell can be assigned a distinct dielectric permittivity value. The surface of the cube consists of 6×N×N panels. The input to the DNN is the cell dielectric permittivity values and the output is the values of the Green's function along with the values of its gradient expressed in x, y and z directions for each surface panel. All the above lead to input and output vectors of sizes N×N×N and 4×6×N×N respectively. Assuming a set of P allowable permittivity values, P (N×N×N) distinct transition cubes can be generated based on the discretization scheme described in U.S. Pat. No. 10,274,533. During supervised training, the training set consists of a random collection of examples drawn from this space of possible cubes. One training example consists of dielectric permittivity values within the cube along with the values of the induced Green's function and the values of its gradient along the x, y, z axes on the surface of the cube. Examples are generated uniformly at random, and persisted to facilitate training. In order to avoid storing huge quantities of data, while loading the training set, data augmentation is implemented. In such a scenario, the symmetry group (S4) of the cube can be exploited to augment the dataset. Specifically, for each stored example up to 24 more can be dynamically generated.

However, in the neural network architecture that will be described shortly, the symmetry properties of the cube are exploited within the architecture of the network. Data augmentation via rotation would generate redundant training data in this case. Efficient training can be achieved by forming a data pipeline that streams the input file data, shuffles examples in batches and optionally augments them. While a cube is used in the example of this description, other volumes in space may also be used.

Figure 2C:
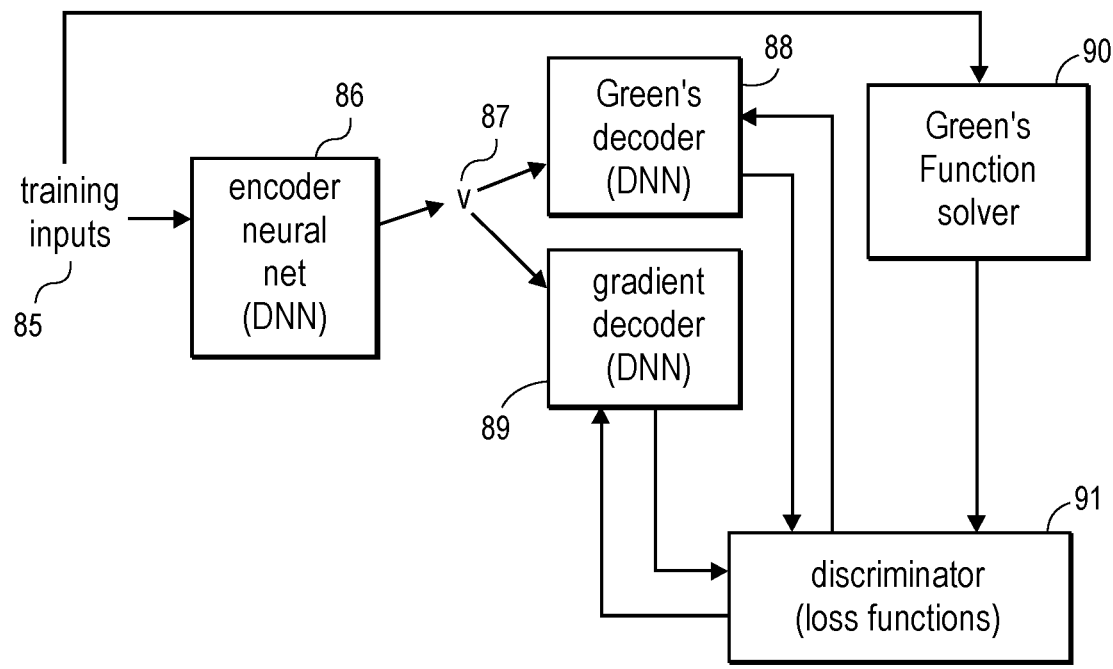
FIG. 2C illustrates an example of an architecture in a system for training a set of neural networks according to one embodiment.
Figure 2D:
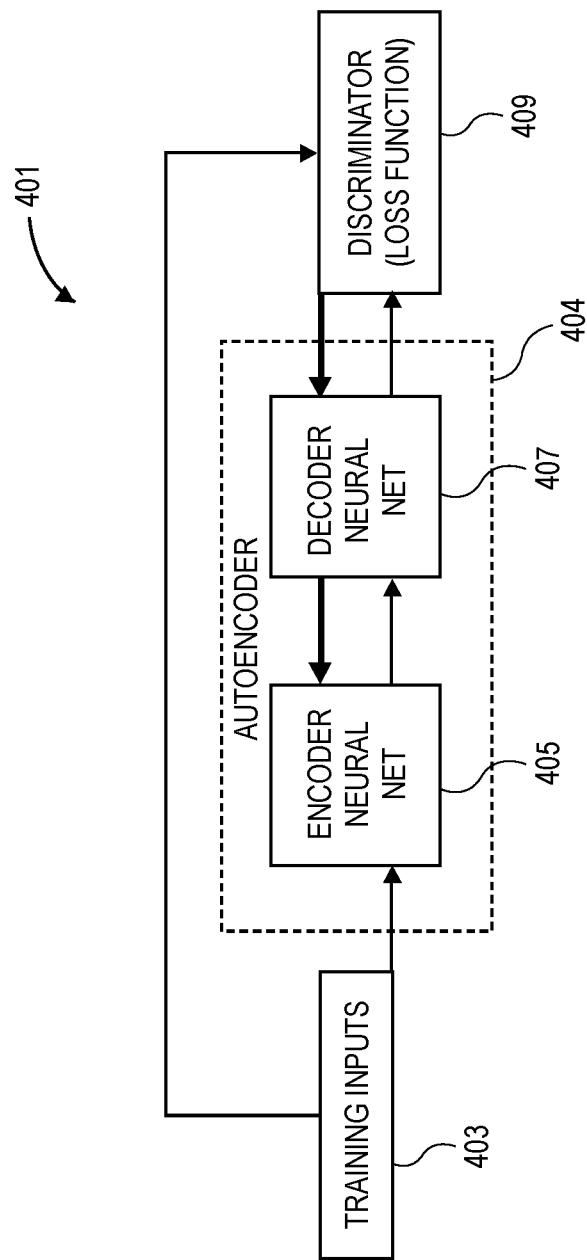
FIG. 2D illustrates an example of an architecture of a system for training the Domain Encoder network according to one embodiment.
Figure 2E:
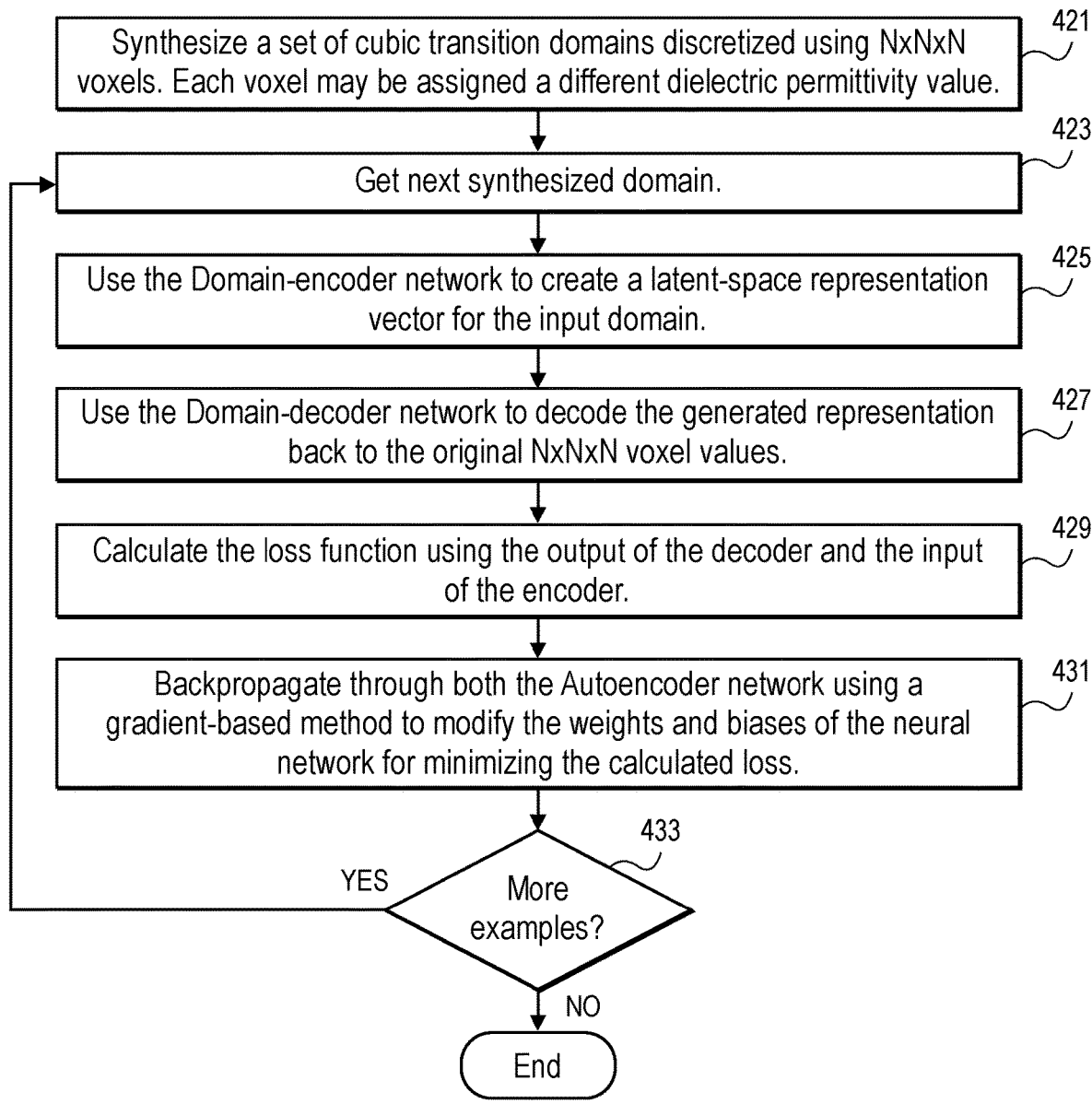
FIG. 2E is a flow chart that shows a method to train the Domain Encoder network as part of an autoencoder network.

A domain encoder is trained first in an autoencoder network, shown in FIG. 2D, before training the decoder networks 88 and 89 in FIG. 2C. FIG. 2D shows an architecture 401 of a training system that can perform the method shown in FIG. 2E; this system can be used to train the Domain Encoder neural network (e.g., domain encoder 153) in the embodiments shown in FIGS. 4A, 4B, 4C and 5A. In this training system, the set of inputs 403 (dielectric permittivity values in cells in the discretized volume synthesized in operation 421 in FIG. 2E) is input (in operation 425 in FIG. 2E) to an encoder neural network 405, which must be able, in one embodiment, to output a rotationally equivariant latent space representation of its input. These encoded output values are applied as inputs (in operation 427 in FIG. 2E) to the decoder subnetwork 407 of the autoencoder 404, which can be a deep neural network with transposed convolution layers. This decoder network 407 then generates outputs, and the outputs during training from the decoder network 407 are then provided to a discriminator 409 that also receives the set of inputs 403. The discriminator then computes (in operation 429 in FIG. 2E) a set of values using a set of loss functions, and these values are back propagated (in operation 431 in FIG. 2E) to the neural networks 407 and 405 to adjust the weights within each neural network to thereby train them over a series of iterations of this process. The decoder subnetwork 407 of the autoencoder network 404 is only used for training the encoder network and discarded afterwards. After training the encoder network 405, the trained encoder network 405 can be used in the method of FIG. 2B to train the decoder networks 88 and 89, and the trained encoder network 405 can be the encoder neural network 86 in FIG. 2C.

FIG. 2B shows an example of a method for training a set of neural networks according to one embodiment. In operation 71, a training system (e.g., a data processing system) can receive a model that represents a volume (e.g., a discretized cubic domain) in an IC. The cube can be discretized into a set of N×N×N cells, and the training system can also receive a set of allowable permittivity values for each cell. In operation 73, the training system can generate a set of N×N×N dielectric permittivity values respectively associated with each of the N×N×N cells (each cell dielectric value being one of the allowable permittivity values). Then in operation 75, the training system can formulate a relationship of electric potentials between a center point of the cube and the cell surfaces of the cube according to a Green's function. In operation 77, the training system can invoke a solver (e.g., an FDM solver) to determine the relationship characterized as 6×N×N Green's function data for each cell surface and 3×6×N×N Green's function gradient data along x, y, and z directions for each cell surface. The encoder neural network is trained as part of an autoencoder neural network using the sets of dielectric permittivity values generated in operation 73. The set of decoder neural networks is then trained, in operation 79, using the feedback from a discriminator based on the difference between the truth outputs from the solver and the outputs from the set of neural networks. The discriminator provides values derived from a set of loss functions, and these values adjust weights in the set of neural networks to train the set of neural networks. In operation 81, the training system then generates and stores values (for use at inference time) the Green's function model for the dielectric domain based on the trained neural network for the cube.

Figure 4A:
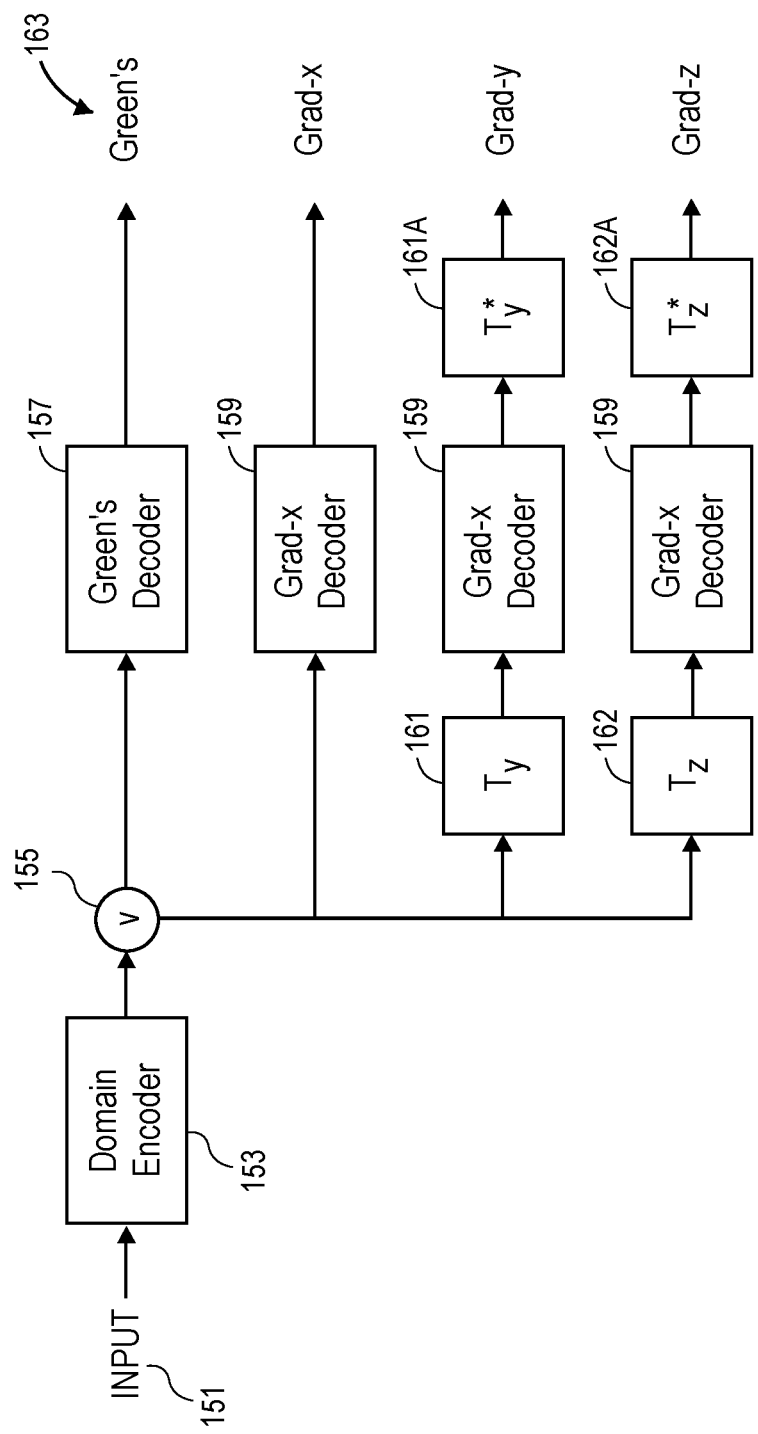
FIG. 4A shows an example of an encoder and decoder architecture that can be used with one or more embodiments described herein.
Figure 5A:
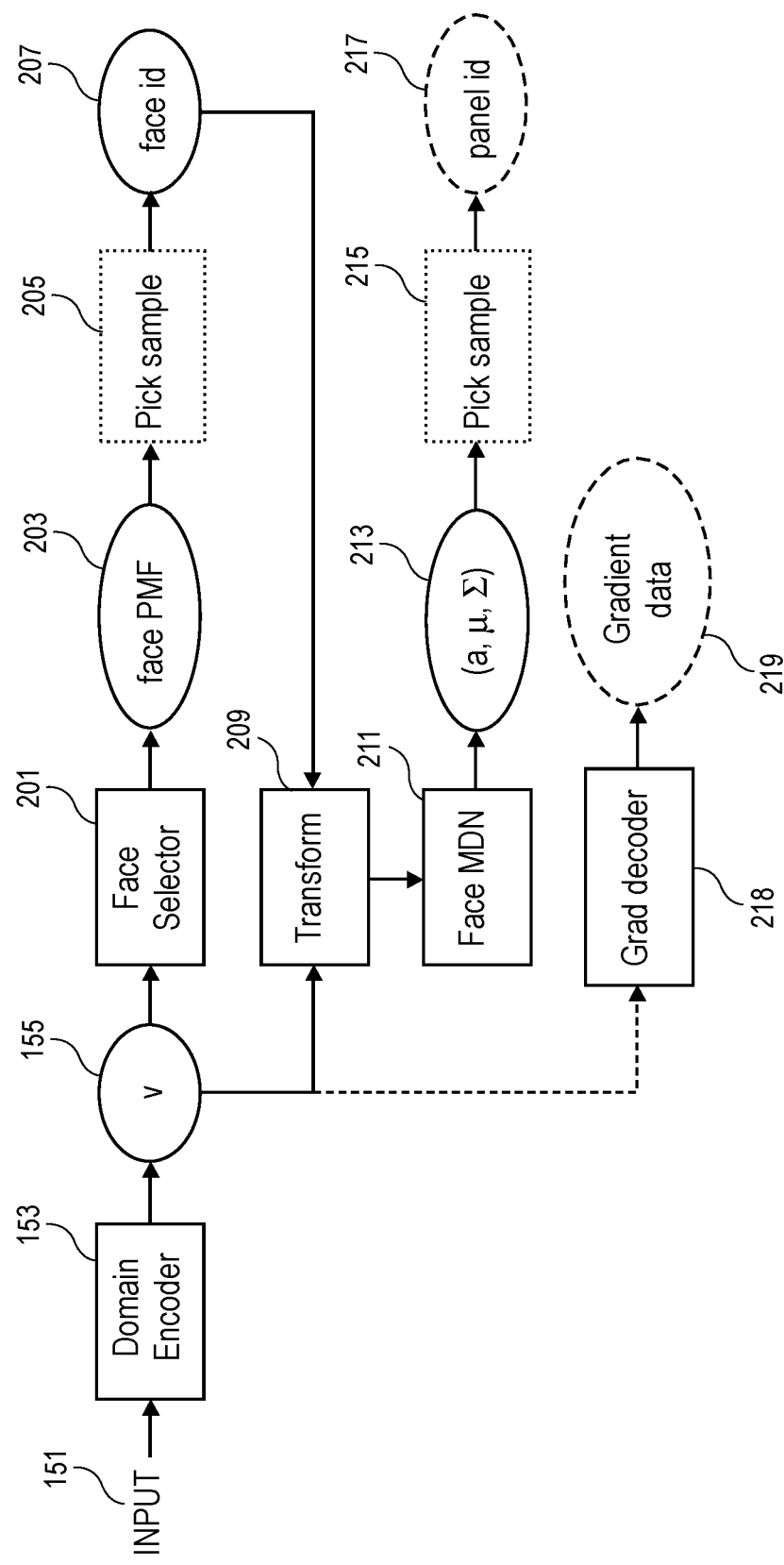
FIG. 5A shows an alternative example of an encoder and decoder architecture that can be used with one or more embodiments described herein.

FIG. 2C shows an example of a training system that can perform the method shown in FIG. 2B; this system can be used to train neural networks in the embodiments shown in FIGS. 4A and 5A. In this training system, the set of inputs 85 (dielectric permittivity values in cells in the discretized volume) is input to a trained encoder neural network 86, which can be a deep convolutional neural network, and the trained encoder neural network 86 provides a set of encoded output values (v) 87 in latent space. The trained encoder neural network 86 can be trained in the architecture shown in FIG. 2D using the method shown in FIG. 2E. These encoded output values 87 are applied as inputs to two subnetworks, Green's decoder neural network 88 (which can be a deep convolutional neural network) and gradient decoder 89 (which can be a deep convolutional neural network). These decoder networks then generate outputs, and the outputs during training from these decoder networks 88 and 89 are then provided to a discriminator 91 that also receives an output from a Green's function solver 90 based on the inputs 85. The discriminator then computes a set of values using a set of loss functions, and these values are back propagated to the neural networks 88 and 89 to adjust the weights within each neural network to thereby train them over a series of iterations of this process.

Figure 3A:
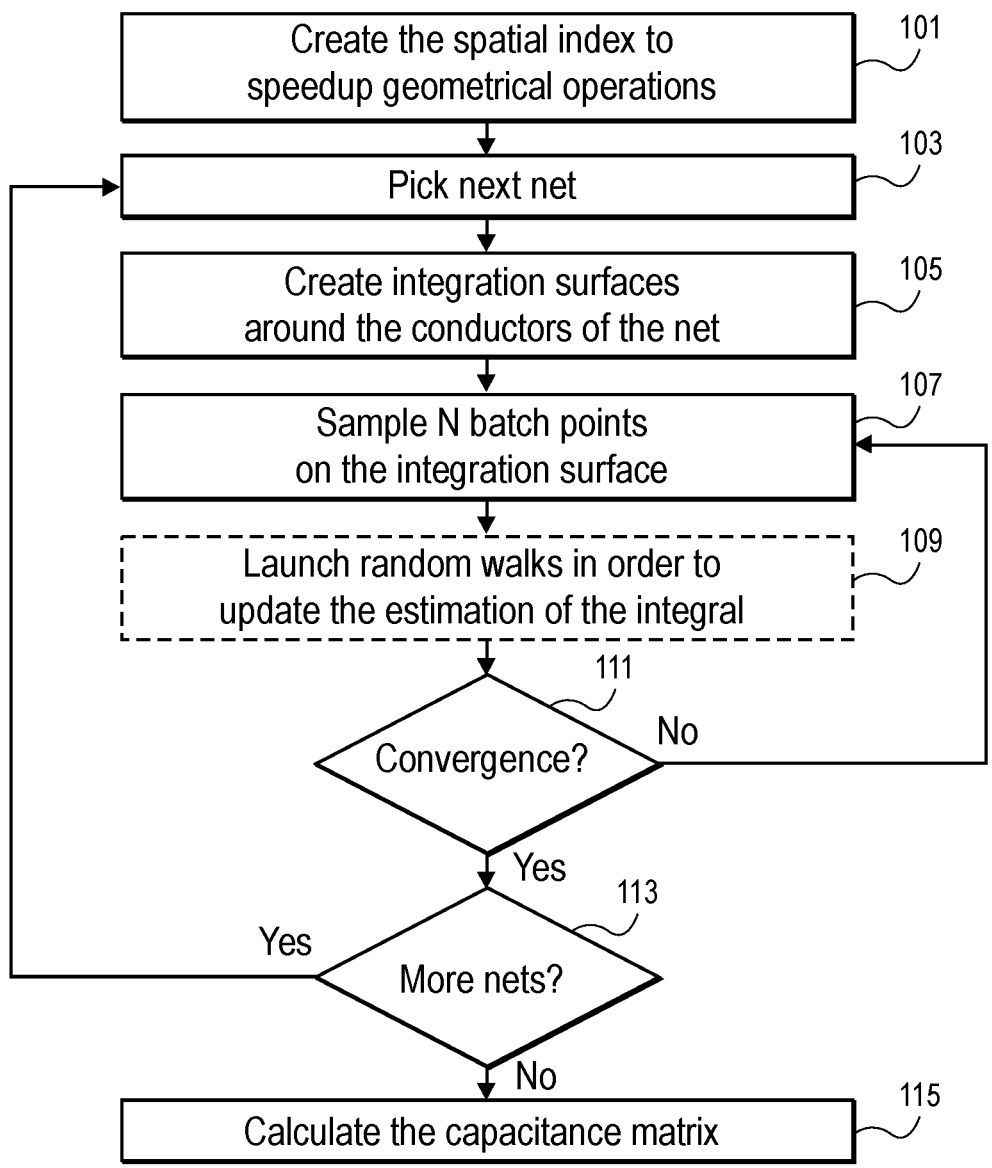
FIGS. 3A and 3B are flowcharts that show the random walk algorithm for extraction of capacitance values from the design of an electrical circuit and how it can utilize a trained set of neural networks according to one embodiment.
Figure 3B:
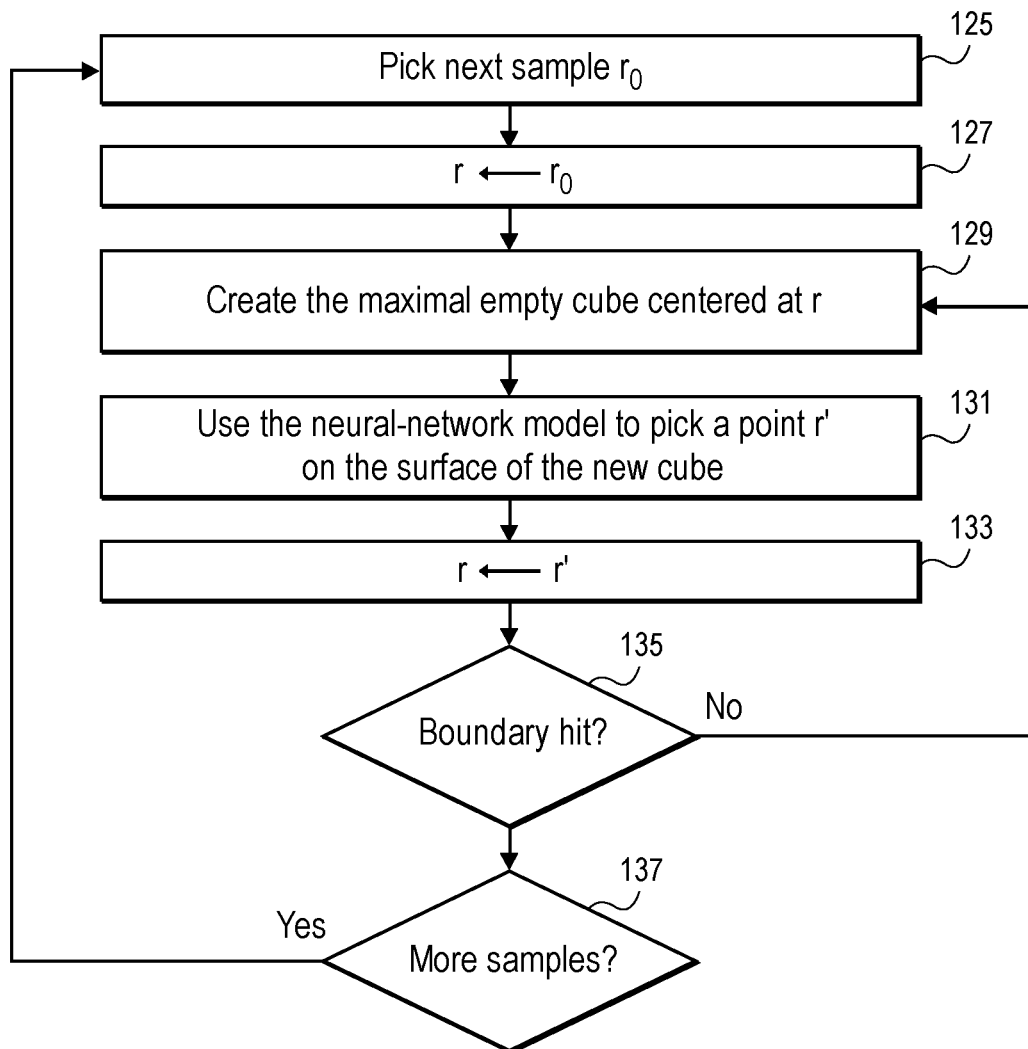

FIGS. 3A and 3B show an example of how a trained set of neural networks can be used to generate extracted capacitance values in the context of a random walk algorithm according to the embodiments described herein. In operation 101, the trained system creates a spatial index to speed up geometric operations. In operation 103, the trained system selects a next set of conductors which can be referred to as a net. Then the trained system in operation 105 creates integration surfaces around the next set of conductors of the net. In operation 107, the trained system then samples N batch points on the integration surface in order to prepare for the launching of random walks in order to update the estimation of the integral of the enclosed electric charge (according to Gauss's theorem). Operation 109 launches the random walks in order to update the estimation of the integral. Operation 109 involves a set of sub operations which are further shown in FIG. 3B which will be described below. Then in operation 111, the trained system determines whether the estimation has converged to a solution. If it has not, processing reverts back to operation 107 to sample another set of batch points on the integration surface. If it is determined the solution has converged in operation 111, the trained system then determines whether or not there are more networks of conductors to analyze in operation 113. If there are more networks of conductors to analyze, processing reverts back to operation 103. Otherwise, if all available networks of conductors have been processed, then processing in the trained system can proceed to operation 115 in which the trained system can calculate the capacitance matrix to extract capacitance values from the design.

As described above, operation 109 includes several operations shown in FIG. 3B. In operation 125, the system selects the next sample $r_0$ and sets, in operation 127, the sample $r_0$ to be the next sample value for further processing. Then in operation 129, the system creates the maximal empty cube center at r. Then in operation 131, the system uses the neural network model to select a point r' on the surface of the new cube, and in operation 133, the system sets the value of r to be r'. Then in operation 135, the system determines whether the boundary (e.g., a conductor's surface) has been hit along the current walk. If operation 135 determines that the boundary has not been hit, the processing reverts back to operation 129. On the other hand, if the boundary has been hit then processing proceeds to operation 137 to determine whether there are more samples to be processed. If there are more samples to be processed, then processing reverts back to operation 125 to continue the random walk.

Figure 4B:
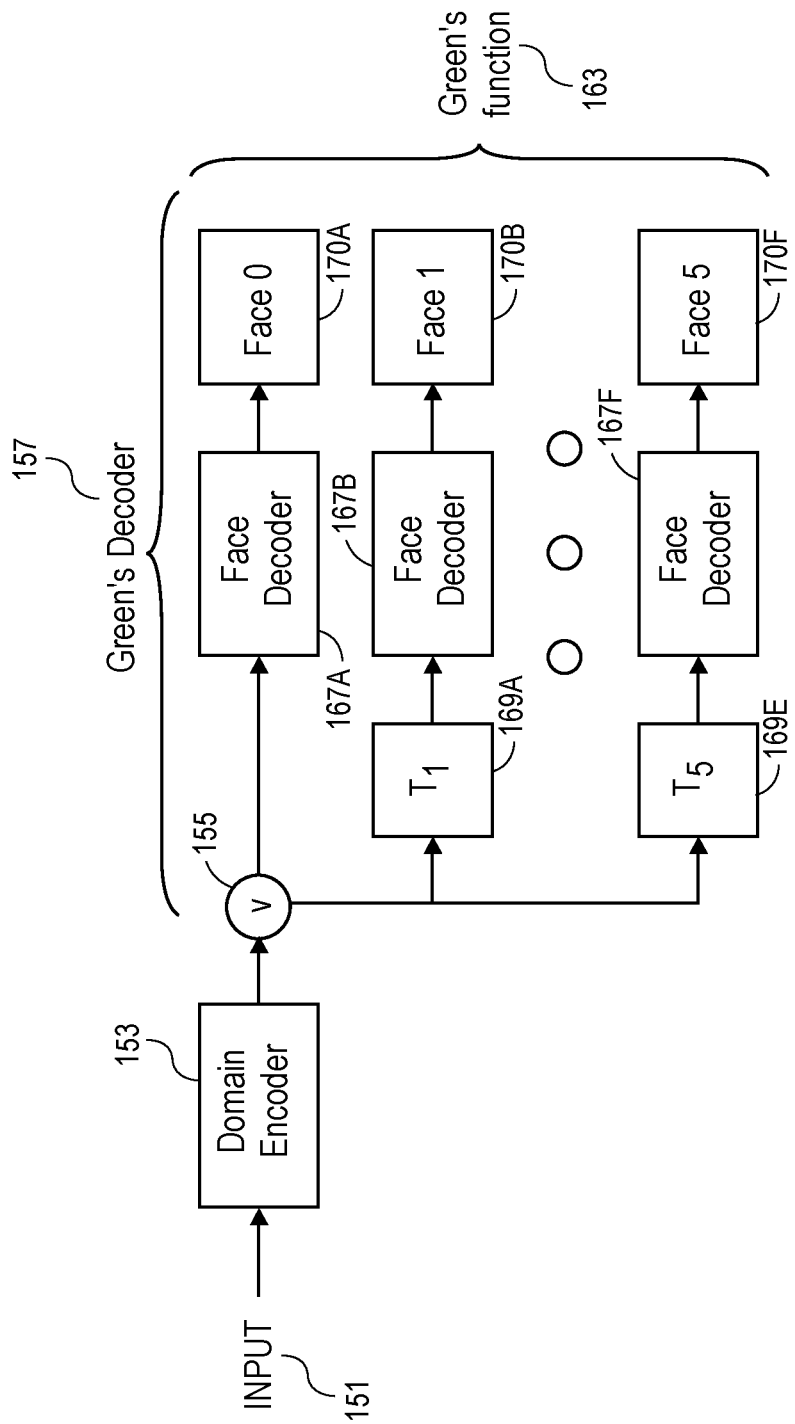
FIG. 4B shows an example of a Green's function decoder that can be used in the architecture shown in FIG. 4A.
Figure 4C:
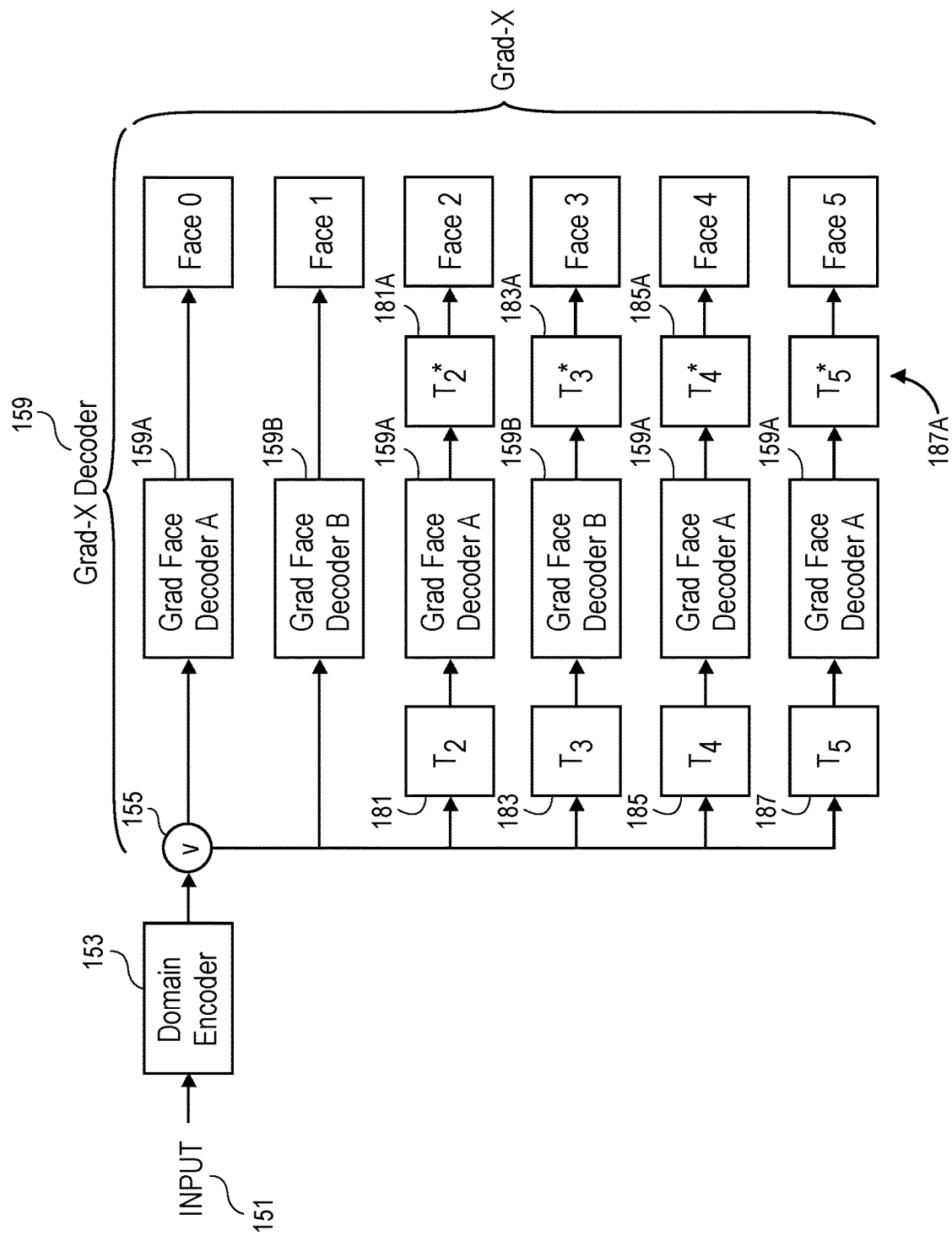
FIG. 4C shows an example of a gradient decoder that can be used in the architectures shown in FIG. 4A or 5A.

FIGS. 4A, 4B and 4C show an example of an embodiment that uses a set of neural networks to extract capacitance values. As illustrated in the high-level architecture of FIG. 4A, the notion of encoding and decoding networks is used in this embodiment. The encoder network transforms the input domain permittivity values, which are essentially a voxelized 3D (three dimensional) input, into a latent space representation that is able to encode all salient information for permittivity values as pertaining to transitions along random walks. In one embodiment, it essentially learns an abstract representation of the input domain. This single latent space representation vector is then used by multiple face decoder branches to assemble the final results that can be considered to be a set of 2D (two dimensional) surface functions. In one embodiment, all of the neural networks can be deep convolutional neural networks, where 3D group equivariant convolutional layers are used during encoding and 2D transposed convolutional layers are used for decoding. A specific architecture used in one embodiment uses an encoder network with $N^3$ inputs that outputs a representation vector of tunable size and three face decoder networks each having the representation vector as input and $N^2$ nodes as output. During random-walk-based capacitance extraction the Green's function is required for every step of every walk, while the gradient of the Green's function is necessary only for the first step of each walk. The system architecture allows calculating the gradient only when it is required. The domain encoder is called once for both Green's and gradient calculations; in one embodiment, at inference time when the trained system is used, the transformed versions of the latent space representation v can be grouped and passed to the face decoder subnetworks in batches, thus enabling significant performance gains. Transformation operations in FIG. 4A are indexing operations with negligible contribution to both training and inference time and are to be elaborated on later in this document. An important aspect of this architecture though is how the symmetry properties of the cube and the corresponding symmetry properties of the Green's function and its gradient are exploited in order to reduce model complexity and consequently model size and final inference time. This is accomplished through weaving the symmetries of the cube into the training procedure. A single encoder can then be used for all face decoders and face decoder networks can be reused multiple times with transformed inputs. In total, taking symmetries into account, the training procedure boils down to pinpointing a single encoder and three decoder networks. If cube symmetries had been ignored, training on a transition domain discretized with, e.g., N=21 would have required a network with 213=9261 input nodes and 4×6× $N^2$=10584 output nodes. As described below, in order to achieve the above, the latent space representation produced by the encoder should be equivariant to the rotation group of the cube.

As shown in FIG. 4A, the trained system includes a set of trained neural networks that includes a domain encoder 153 that receives inputs 151 (permittivity values for a set of cells in a discretized volume such as a cube) and produces an encoded output (v) 155 that is a representation of the inputs 151 in latent space. The trained domain encoder has been trained to learn a multipurpose latent space representation that corresponds to the inputs 151. This encoded output 155 is then provided as inputs to the Green's decoder 157 and the set of gradient decoders 159 (each of which is a gradient x decoder in the x axis in this embodiment), so the gradient x decoder is re-used and this reduces the size of the trained system at inference time of the trained system. As explained further below, the symmetry properties of the cube in this embodiment enable reuse of the gradient x decoder for calculating the y axis and z axis gradients. Transformed versions of the encoded output 155 in the latent space are passed (through transformers 161 and 162) to the second and third instance of the gradient x decoder 159 (as shown in FIG. 4A) and then these instances of the gradient x decoder 159 provide outputs that are inverse transformed (by transformers 161A and 162A) to provide the outputs of the gradient in y and z. The first instance of the gradient x decoder provides an output of the gradient in x. The Green's decoder 157 provides an output of the Green's function value, and these outputs (Green's function value and its gradient in x, y, and z) are collectively shown as outputs 163 in FIG. 4A. The transformation operations in transformers 161, 162, 161A and 162A can be implemented as low overhead tensor indexing operations in one embodiment. Transformation operations 161 and 162 are permutation operations that change positions of the components of the vector in the latent space (e.g., 1,2,3 becomes 2,3,1). These transformations map rotations of the input domain cube into the latent space (consult rotational equivariance later on in this document). Inverse transformations 161A and 162A are permutation operations that preserve indexing conventions used for storage of these quantities.

FIG. 4B shows an example of an embodiment of the Green's decoder 157. In this embodiment, Green's decoder 157 includes a set of face decoders 167A, 167B, 167C, 167D, 167E and 167F each of which is the same trained instance of the Green's decoder used for one of the respective faces of the transition cube. Face decoders 167C, 167D and 167E are not shown in order to simplify the figure. In an alternative embodiment, a single Green's decoder can be instantiated and reused for each of the respective faces rather than having 6 instances of the same Green's decoder at inference time. The face decoders 167A-167F receive the encoded output 155 and produce the outputs 170A, 170B, 170C, 170D, 170E, and 170F. The face decoder 167A produces the output 170A directly from the untransformed version of the encoded output 155; the face decoder 167B produces the output 170B from a transformed version of the encoded output 155 that is produced by the transformer 169A and the face decoder 167F produces the output 170F from a transformed version of the encoded output 155 that is produced by the transformer 169E. In this embodiment a single 2D convolutional network suffices to decode the Green's function for all 6 faces of the transition cube. The transformations T1, T2, T3, T4, and T5 are permutations of the latent space representation v that correspond to rotations in the input domain (shown as encoded output 155); due to the rotational equivariance property, there is an established mapping between transformations of v and rotations in the input domain. Further information about rotational equivariance is provided below.

Figure 6:
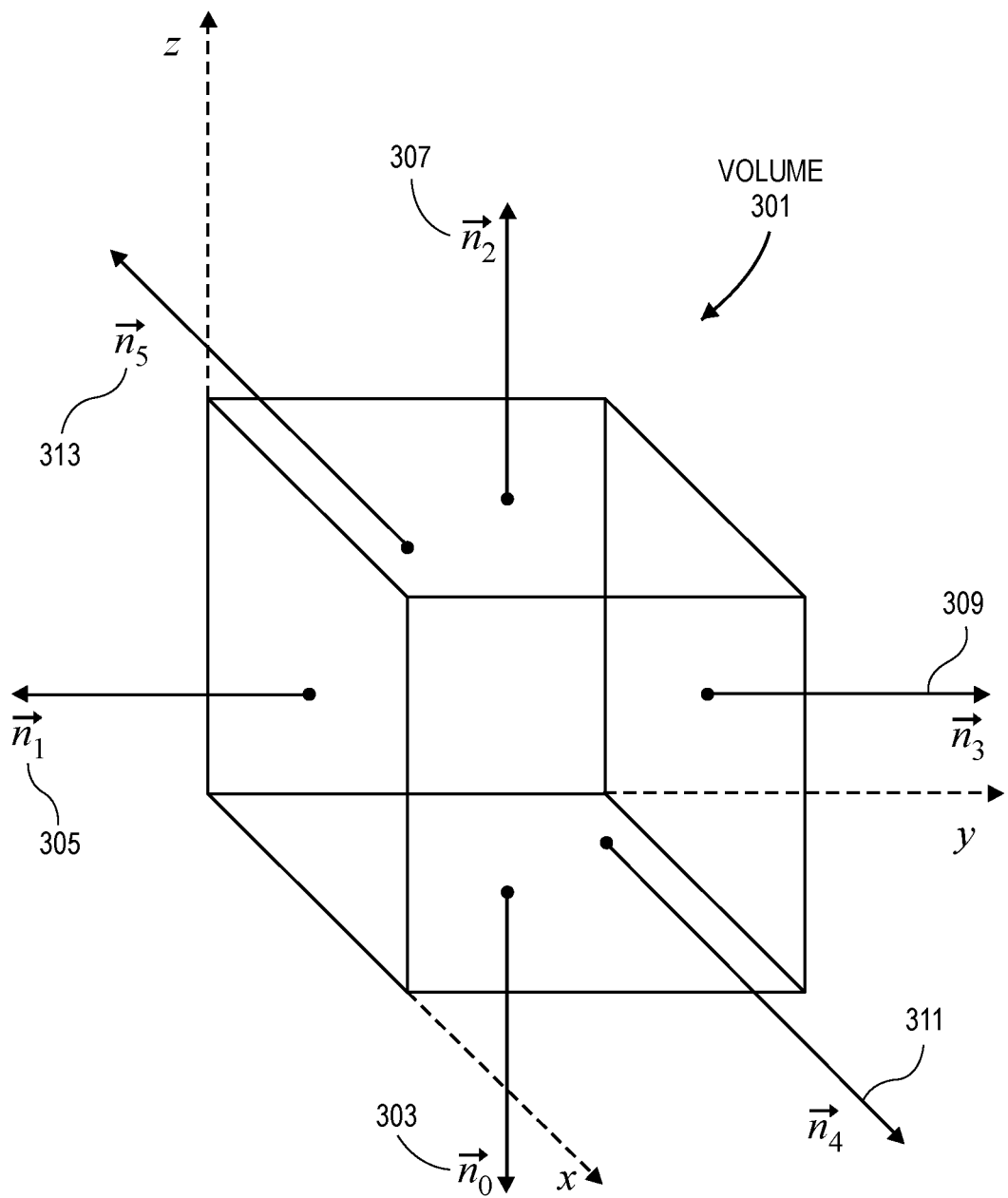
FIG. 6 shows an example of the re-use of face decoder networks in gradient decoders in order to reduce model size according to one embodiment.

FIG. 4C shows an example of an embodiment of the gradient x decoder 159. In this embodiment, gradient x decoder 159 includes a set of face decoders 159A and 159B. Each of these two face decoders (159A and 159B) are instantiated multiple times to provide a total of six face decoders as shown in FIG. 4C; in other words, the gradient x decoder is decomposed into face decoders 159A and 159B that are instantiated multiple times. FIG. 6, described below, shows an example of how the gradient x decoder is decomposed into the two face decoders (grad face decoder A and grad face decoder B based on surface normal vectors) that are trained separately (e.g., in isolation). As shown in FIG. 4A, the gradient x decoder 159 is reused to calculate the gradient y and gradient z values in order to assemble the Green's gradient for all faces of the transition cube. As shown in FIG. 4C, the first instance of face decoder 159A and the first instance of face decoder 159B (starting from the top of the figure) receive an untransformed encoded output 155 (v) and produce a gradient output for faces 0 and 1 (respectively) of the transition cube. Continuing from the top of the FIG. 4C, the second instance of face decoder 159A receives a transformed version of encoded output 155 (transformed by transformer 181) and provides a gradient output for face 2 of the transition cube; this gradient output for face 2 is provided through transformer 181A which transforms the output from the face decoder 159A. The second instance of face decoder 159B receives a transformed version of encoded output 155 (transformed by transformer 183) and provides a gradient output for face 3 of the transition cube; this gradient output for face 3 is provided through transformer 183A which transforms the output from the face decoder 159B. The third instance (from the top of the FIG. 4C) of face decoder 159A receives a transformed version of encoded output 155 (transformed by transformer 185) and provides a gradient output for face 4 of the transition cube; this gradient output for face 4 is provided through transformer 185A which transforms the output from the face decoder 159A. The last instance (from the top of the FIG. 4C) of face decoder 159A receives a transformed version of encoded output 155 (transformed by transformer 187) and provides a gradient output for face 5 of the transition cube; this gradient output for face 5 is provided through transformer 187A which transforms the output from the face decoder 159A. Transformers 181, 183, 185, and 187 produce transformations of the encoded output 155 that correspond to rotations of the input transition cube. The transformers 181A, 183A, 185A, and 187A produce, in one embodiment, transformations that are indexing transformations that may be required to meet the node indexing conventions for each face of the transition cube.

FIG. 6 shows an example of how a set of face decoder neural networks can be reused in the gradient decoders, such as the gradient decoders used in the architecture of FIGS. 4A and 5A. The transition volume 301 can be a cube that has six faces, each of which has a normal vector projecting from the corresponding face. Gradient x decoder can be decomposed into two gradient decoders (e.g., gradient face decoders A and B in FIG. 4C) that can be instantiated in multiple copies to create the gradient solutions for all 6 faces of the transition volume 301. Each normal vector of a face is a vector that is perpendicular to that face and extends outwardly from the face; each face is assumed to be a plane. As shown in FIG. 6 the six normal vectors are: normal vector 303 which extends from the bottom face, normal vector 305 which extends from the left face, normal vector 307 which extends from the top face, normal vector 309 which extends from the right face, normal vector 311 which extends from the front face, and normal vector 313 which extends from the back face. In one embodiment, a face decoder (e.g., gradient face decoder B) is trained to decode Green's gradient for faces having a normal vector that is parallel to the axis of the gradient being calculated (e.g., the gradient x); in this case, the gradient face decoder B is trained to decode the Green's gradient for the faces with the normal vectors 311 and 313 (because the normal vectors of these faces are parallel to the x axis). In this case, the gradient face decoder A is trained to decode Green's gradient for faces having a normal vector that is perpendicular to the axis of the gradient being calculated (e.g., the gradient x); in this case, the gradient face decoder A is trained to decode the Green's gradient for the faces with the normal vectors 303, 305, 307 and 309 (because the normal vectors of these faces are perpendicular to the x axis). This arrangement decomposes the gradient x decoder into two separate gradient decoders as shown in FIG. 4C (as gradient decoders A and B).

Group Equivariant Convolutional Networks

Deep convolutional neural networks (CNNs) have produced impressive results in many fields (such as image and video processing) due to their many desirable properties: weight-sharing and regularization through filtering as well as translation invariance. The latter is their ability to preserve the structure of the input under translations. i.e., a translated input fed through a filter is the exact same as directly translating the filtered original image. In a broad sense, translation invariance guarantees that an inherent characteristic of the input, i.e., that it stays the same while being moved around in flat space, is preserved in the activations of the network. An efficient neural network architecture that exploits the specific 3D cube structure used in the disclosed embodiments can use group equivariant CNNs described herein.

Although conventional CNNs provide translation invariance, they are not invariant (or more loosely equivariant) to rotations. Rotation invariance can be learned implicitly through data augmentation, but a more principled and robust training approach has been investigated in recent years. According to this approach, networks are directly trained with a generalized convolution operation (group convolution) which directly encodes rotation equivariance. In a broad sense, rotation invariance guarantees that another inherent characteristic of the input, i.e., that is stays the same while being rotated in flat space, is preserved in the activations of the network.

For the purposes of the embodiments in this disclosure, the more general notion of rotation equivariance is used. The procedure described herein draws upon the Group Convolutional Network approach introduced in the paper: T. S. Cohen and M Welling, Group equivariant convolutional networks," CoRR, vol. abs/1602.07576, 2016. [Online]. Available at: http://arxiv.org/abs/1602.07576 [hereinafter referred to as Cohen]; and also draws upon a paper for cube rotation groups: D. E. Worrall and G. J. Brostow, "Cubenet: Equivariance to 3d rotation and translation," CoRR, vol. abs/1804.04458, 2018. [Online]. Available at: http://arxiv.org/abs/1804.04458 [hereinafter referred to as Worrall].

As described in Cohen, a network or layer $\Phi$ is equivariant and thus structure-preserving with regard to a set of transformations $g \in G$ if:

$$\Phi(T_g X) = T'_g \Phi(x)$$

The set of transformations G should form a group; see Worrall. For an equivariant network, the result of a function applied to transformed input is the same as the (differently) transformed output of the function of the original input. If $T'_g = 1$ we have the case of invariance. T and T' are different in our case with a relation derived from the Cayley table of the rotation group of the cube (see Worrall).

Rotation equivariance can be achieved by either rotating the filters or the activations and training simultaneously on all combinations of rotations. Custom group convolution layers are defined and composed into an equivariant convolutional network. Following the notation that is used in Cohen, the 3D standard convolutional layer l takes as input a set of feature maps $f: \mathbb{Z}^3 \rightarrow \mathbb{R}^{Kl}$ and a set of $K_{(l+1)}$ filters $\psi^i$: $\mathbb{Z}^3 \rightarrow \mathbb{R}^{Kl}$ and convolves them:

$$[f * \psi^i](x) = \sum_{y \in \mathbb{Z}^3} \sum_{k=1}^{K_L} f_K(\mathcal{Y}) \psi_K^i(x-y)$$

Similarly, a generalized version of the convolution operation is defined by replacing the translation operation with any operation g from some group G. The first group convolutional layer will perform:

$$[f * \psi^i](g) = \sum_{y \in \mathbb{Z}^3} \sum_{k}^{K_L} f_K(\mathcal{Y}) \psi_K(g^{-1}\mathcal{Y})$$

and the following layers:

$$[f * \psi^i](g) = \sum_{h \in G} \sum_{k}^{K_L} f_K(h) \psi_K(g^{-1}h)$$

Embodiment with Gaussian Mixture Model

FIGS. 5A, 5B, 5C and 5D illustrate an embodiment that uses a Gaussian mixture model (GMM) to approximate the Green's function on the face of a transition cube. In this embodiment, the Green's function is not explicitly calculated; rather, the approximation of the Green's function is derived from the Gaussian mixture model. This reduces the amount of the required nodes in the neural networks and improves both inference and random sampling times. Hence, a data processing system programmed with this embodiment can operate more efficiently because it can use less memory and produce extracted capacitance values more quickly than prior methods. The architecture used in this embodiment can be considered to use ancestral sampling (or equivalently sampling from a directed probabilistic graphical model).

FIG. 5A shows the overall architecture of the neural networks in this embodiment that uses a GMM. The same group equivariant neural network encoder 153 (used in the embodiment in FIG. 4A) is used in this embodiment of FIG. 5A, and it produces an encoded output 155 (v) in the latent space for a given input 151. The encoded output 155 is then applied as an input to a face selector neural network 201, an input to transformer 209, and as an input to the gradient decoder 218. As explained above, the gradient decoder 218 can be used only for the first domain transition of each random walk (and thereafter is not used for the remainder of each walk); this embodiment in FIG. 5A can use the version of the gradient decoder 159 shown in FIG. 4C, and this gradient decoder 218 can produce an output of gradient data 219 for each random walk.

Instead of the Green's decoder 157 used in the embodiment of FIG. 4A, the embodiment of FIG. 5A uses two neural networks (each with layers that have fully connected nodes): the face selector neural network 201 and a face mixture density network (MDN) 211. Each of these neural networks can be deep CNNs. The face selector neural network 201, once trained, generates a probability mass function (PMF) 203 for a given v from encoded output 155, and this PMF is used to select (in pick sample 205) a face (e.g., selected face id 207) on the transition cube; this selected face id 207 is applied as an input to the transformer 209. The face selector neural network 201 is trained to learn a categorical distribution over the six faces of a transition cube for a given v in the latent space. Note that the result of sampling from this PMF should be approximately equivalent to sampling from the prefix sum of the values of the Green's function over the six faces, if those values were actually known. Pick sample 205 can randomly select the face from the PMF, so selected face id 207 can be randomly selected from the PMF. Transformer 209 transforms the encoded output 155 (v) based on the selected face id 207 (in order to match the orientation of the selected face) to provide the transformed encoded output as an input to the face MDN 211. The face MDN 211 is trained to infer the parameters (a, $\mu$, $\Sigma$) 213 of the GMM for a given transformed encoded output (produced by transformer 209) that is supplied as an input to the face MDN 211. Thus, the face MDN generates these inferred parameters 213 (for a given transformed v), and these inferred parameters 213 are used in pick sample 215 to select a point (panel id 217) on the selected face (selected face id 207). The GMM describes how to sample from a face, and once the inferred parameters of the GMM are generated (by the face MDN 211), the GMM can be sampled to produce the selected point (panel id 217). Since the GMM picks a point on a 2D planar face, the GMM should have 2D support.

In one embodiment, the following GMM can used. The probability of moving to a panel on a face of a cube can be approximated using a mixture probabilistic model. A two-dimensional GMM is used in one embodiment:

$$p(t) = \sum_{i=1}^{K} \alpha_i \mathcal{N}\left(\mu_i, \sum_i\right)$$

where K is the number of Gaussian distributions that are part of the mixture, which is a model hyperparameter, $a_i$ is the weight, $\mu_i$ is the mean and $\Sigma_i$ is the covariance matrix of distribution i. α expresses a categorical distribution with $$\sum_{i=1}^{K} \alpha_i = 1$$

The categorical distribution can be thought of as loads on a K-sided loaded die.

Figure 5B:
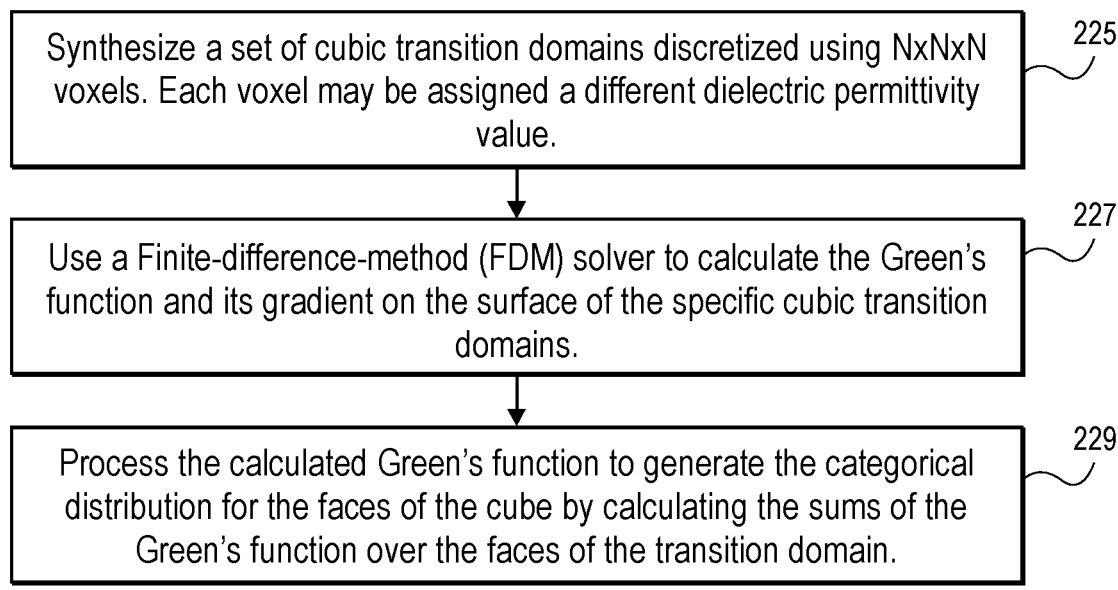
FIG. 5B is a flow chart that depicts a method to generate training data or examples for the architecture shown in FIG. 5A according to one embodiment.

FIG. 5B shows a method according to one embodiment for generating the training examples that are used to train the face selector 201 and face mixture density 211 networks. Once these neural networks are trained, using the method shown in FIG. 5C, they can be used in the method shown in FIG. 5D which can use the architecture shown in FIG. 5A. Referring now to FIG. 5B, a method of generating training examples can begin in operation 225. In operation 225, a data processing system can synthesize a set of cubic transition domains that have been discretized using N×N×N voxels. Each voxel may be assigned a different dielectric permittivity value; the different dielectric permittivity values that are assigned may represent known or standard 3D configurations of dielectrics found in modern semiconductor designs. Then in operation 227, the data processing system can use a finite difference method (FDM) solver to calculate the Green's function and its gradient on the surface of the specific cubic transition domains. Then in operation 229, the data processing system can process the calculated Green's function to generate the categorical distribution for the faces of the cube by calculating the sums of the Green's function over the faces of the transition domain.

Figure 5C:
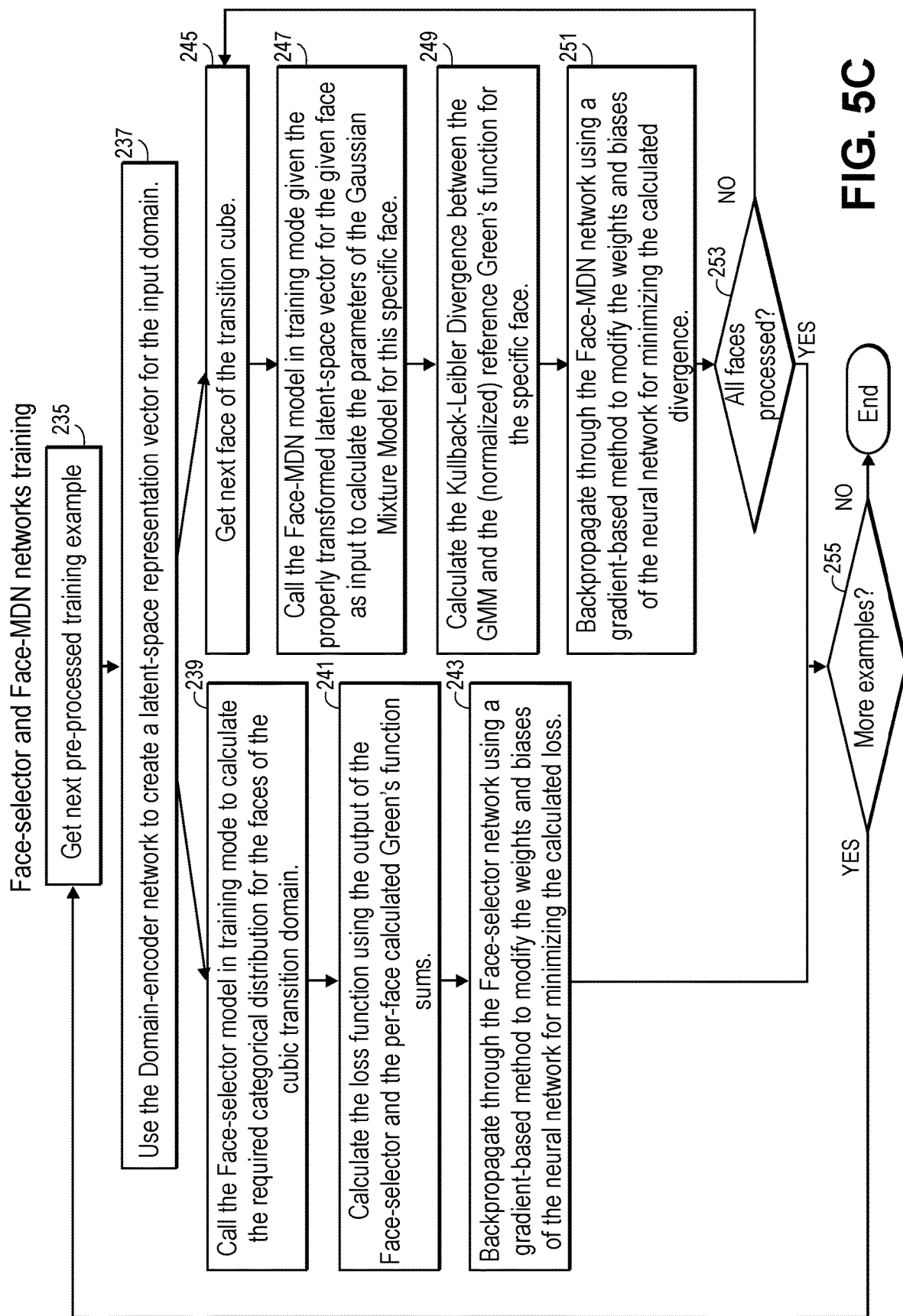
FIG. 5C is a flow chart that shows a method to train the subnetworks in the architecture shown in FIG. 5A according to one embodiment.

FIG. 5C shows a method according to one embodiment for training the face selector neural network 201 and the face MDN neural network 211 using the training examples generated from the method shown in FIG. 5B. In operation 235, the data processing system obtains a set of training examples generated by the method shown in FIG. 5B. Then in operation 237, the data processing system uses the domain encoder network, such as the trained domain encoder 153, to generate a latent space representation (v) which is then used in subsequent operations 239 and 247. Operations 239, 241, and 243 represent operations used to train the face selector neural network 201, and operations 245, 247, 249, 251, and 253 represent operations used to train the face MDN neural network 211.

In operation 239, the data processing system calls the face selector model (an instantiation of the face selector neural network 201 before it is trained) in a training mode to calculate the required categorical distribution for the faces of the cubic transition domain based on the input generated in operation 237 by the domain encoder network. Then in operation 241, the training system calculates the loss function using the output of the face selector model and the per face calculated Green's function sums. Then in operation 243, the training system backpropagates through the face selector network using a gradient-based method to modify the weights and biases of the neural network in the face selector model in order to minimize the calculated loss. Operations 235, 237, 239, 241, and 243 can be repeated over time in order to minimize the loss and thereby train the face selector neural network 201; this repetition over time can be based on more examples being used after the data processing system determines in operation 255 that more examples should be used (e.g., because the calculated loss exceeds a desired level of loss), in which case processing reverts back to operation 235 to continue to train the face selector neural network 201 through these operations.

In operation 245, the data processing system obtains the next face of the transition cube; if this is the first instance of execution for this transition cube, the process can begin with a designated initial face. Then in operation 247, the data processing system can call the face MDN model in training mode given the properly transformed latent space representation for the given face as an input to calculate the parameters of the GMM for this specific face. Then in operation 249, the data processing system can calculate the Kullback-Leibler Divergence between the GMM and the normalized reference Green's function for the specific face. Then in operation 251, the data processing system can back propagate through the face MDN neural network using a gradient-based method to modify the weights and biases of the face MDN neural network for minimizing the calculated diversions. Operations 247, 249 and 251 can be repeated for each face until the calculated divergence is less than a desired level. Each face of the cube is processed as a result of the decision in operation 253 which requires that all faces be processed for the cube for each example. If further faces are required to be processed, then processing reverts back to operation 245 for any unprocessed face. Repetition of operations 247, 249, and 251 can also occur with multiple examples being retrieved from the training examples obtained in operation 235, and each face is processed using a retrieved example.

Figure 5D:
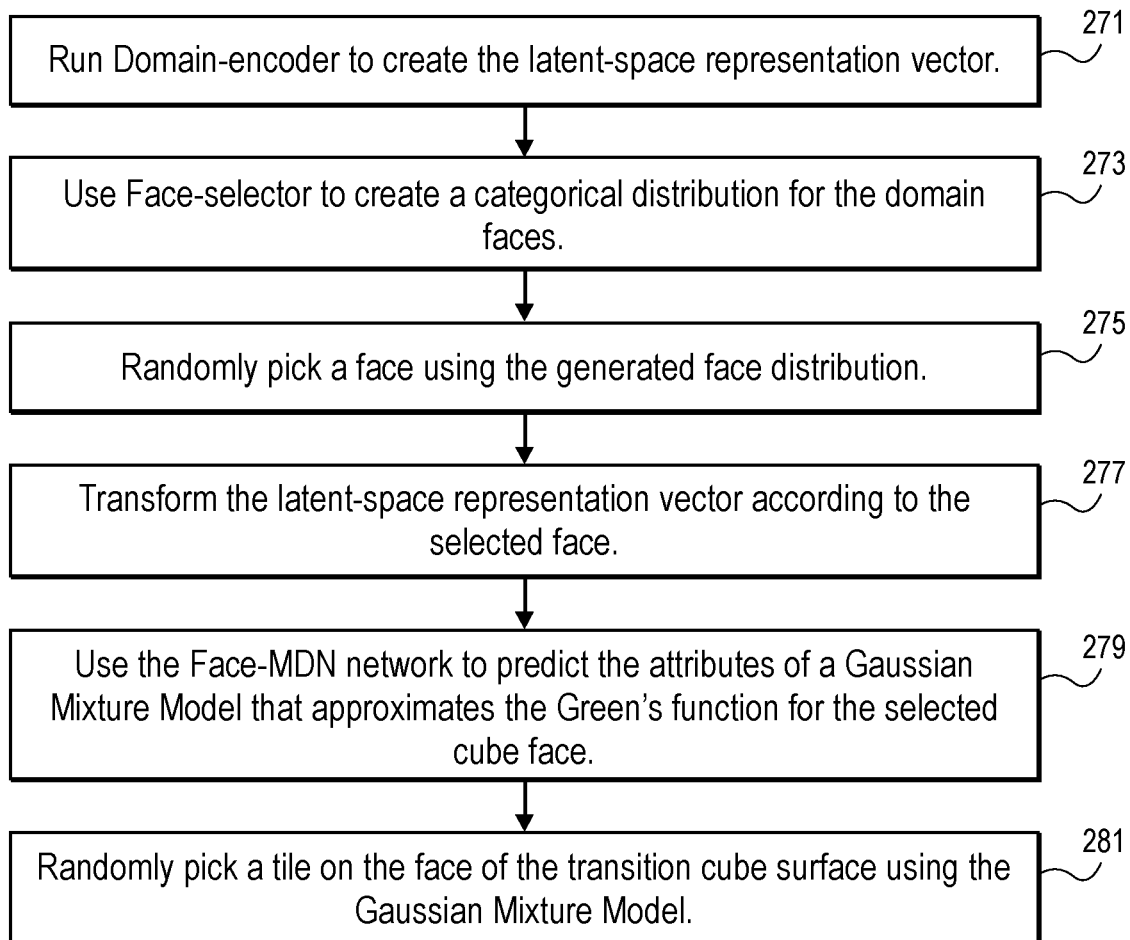
FIG. 5D is a flow chart that shows a method to use the trained set of neural networks in the architecture shown in FIG. 5A according to one embodiment.

FIG. 5D shows a method for using the trained neural networks that have been trained according to the method shown in FIG. 5C; the method shown in FIG. 5D can use the architecture shown in FIG. 5A. In operation 271, the domain encoder (e.g., domain encoder 153) is used to create a latent space representation v. In operation 273, the face selector neural network (e.g., face selector neural network 201) creates a categorical distribution for the domain faces (e.g., face PMF 203). In operation 275, the data processing system can then randomly pick a face (e.g., face id 207) using the generated faced distribution (e.g., face PMF 203) which was just generated in operation 273. In operation 277, the latent space representation is then transformed according to the selected face (e.g., transformer 209 transforms v based on the selected face (face id 207)). In operation 279, the face MDN (e.g., face MDN 211) predicts the attributes of the GMM that approximates the Green's function for the selected cube face. Then in operation 281, the data processing system randomly picks up tile on the selected face of the transition cube surface using the GMM.

Figure 7:
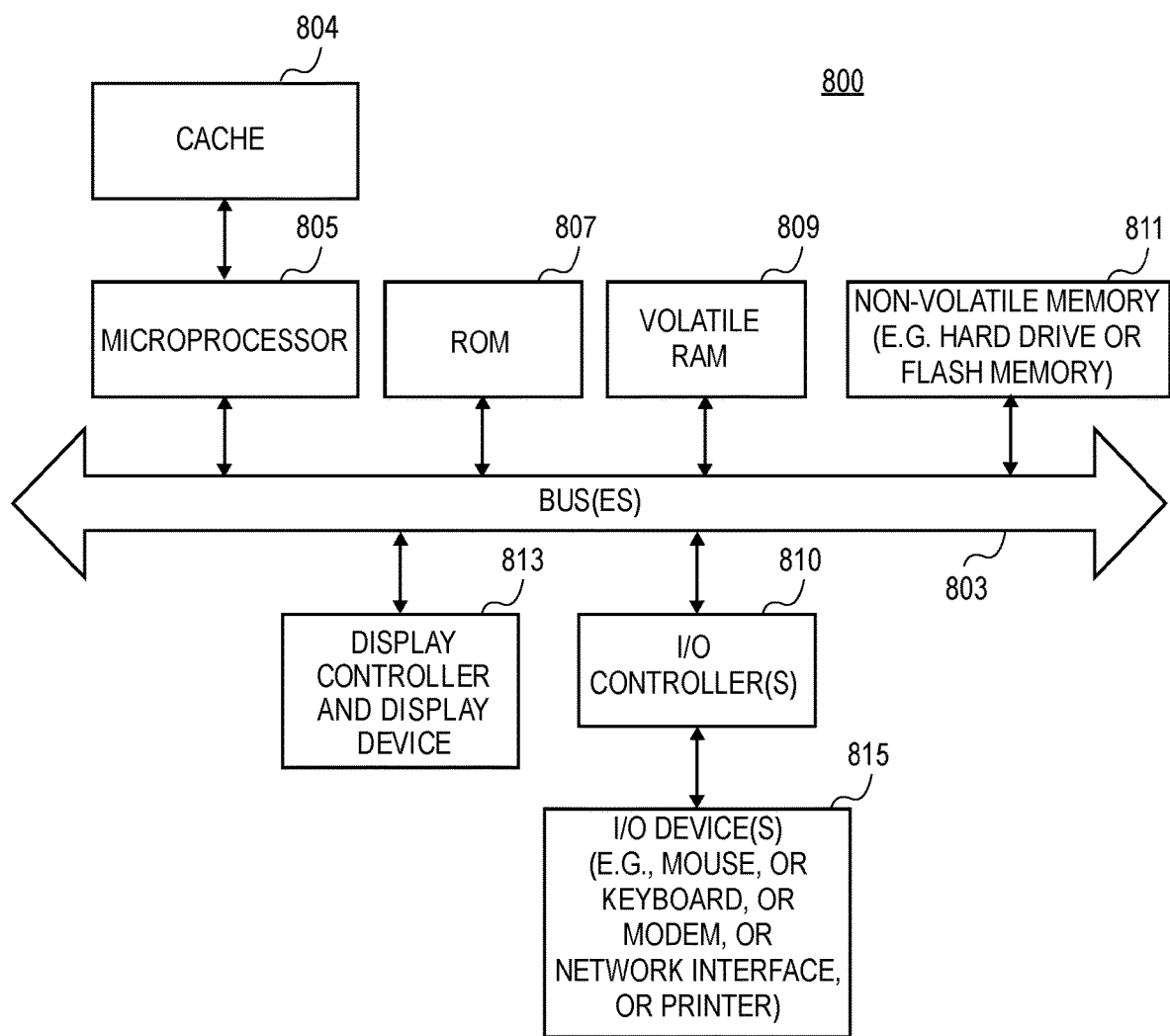
FIG. 7 shows an example of a data processing system that can perform one or more of the methods described herein and also be used to implement a trained simulation system that can extract capacitance values according to one or more embodiments described herein.

FIG. 7 shows one example of a data processing system 800, which may be used with one or more embodiments described herein. For example, the system 800 may be implemented to perform any method described or shown herein, including for example training of the models described herein and use at inference time of the trained models. One instance of the system 800 may be used to train and create the models that can extract capacitance values from an IC, and another instance of the system 800 can be used at inference time to extract capacitance values through a trained model. Note that while FIG. 7 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 7, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (I/O) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 7 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMs, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable medium storing executable instructions that when executed by a data processing system cause the data processing system to perform a method comprising:
    storing a machine learning model that includes a trained set of one or more neural networks that have been trained to represent calculations for a Green's function;
    applying, to the machine learning model, a set of inputs representing a set of dielectric materials present within volumes inside a first design of a circuit;
    encoding the set of inputs through a trained encoder in the one or more neural networks to generate a latent space representation as an encoding of permittivity values of the set of inputs;
    calculating the Green's function of the set of inputs from the latent space representation through one of the one or more neural networks trained for calculation of the Green's function; and
    calculating a gradient of the Green's function of the set of inputs from the latent space representation through the one or more neural networks trained for calculation of the gradient of the Green's function.

2. The non-transitory machine readable medium as in claim 1, wherein a representation of the Green's function is generated, at inference time, during a random walk among a set of conductors and wherein values of the gradient of the Green's function are calculated during the random walk.

3. The non-transitory machine readable medium as in claim 2, wherein the trained encoder encodes characteristics of dielectric permittivity values present within volumes inside the first design of the circuit, and wherein the representation in the latent space is equivariant to rotation of these volumes.

4. The non-transitory machine readable medium as in claim 3, wherein the one or more neural networks trained for calculation of the gradient of the Green's function comprises a neural network trained for a first axis that is also used for gradient computations in a second axis and a third axis after transformations for the second axis and the third axis in order to reduce a size of the machine learning model.

5. The non-transitory machine readable medium as in claim 4, wherein the trained set of one or more neural networks comprises a first face decoder that generates a first Green's function output for a first face of a volume, and the first face decoder is used with a set of transformations of the representation in the latent space to generate a set of Green's function outputs for a second face, a third face, a fourth face, a fifth face, and a sixth face of the volume.

6. The non-transitory machine readable medium as in claim 3, wherein the representation of the Green's function is a Gaussian mixture model that approximates the Green's function for a selected face of a transition volume.

7. The non-transitory machine readable medium as in claim 6, wherein a trained mixture density neural network in the trained set of one or more neural networks infers parameters of the Gaussian mixture model to approximate the Green's function on the selected face.

8. The non-transitory machine readable medium as in claim 7, wherein the inferred parameters of the Gaussian mixture model are used to pick random samples from an approximation of the Green's function for the selected face.

9. The non-transitory machine readable medium as in claim 8, wherein a trained face selector neural network, in the one or more neural networks, receives the representation in the latent space and generates a face distribution from which a face is selected, and the representation in the latent space is transformed based on the selected face and applied as an input to the trained mixture density neural network.

10. The non-transitory machine readable medium as in claim 9, wherein the gradient of the Green's function is calculated only once over a path of the random walk.

11. A non-transitory machine readable medium storing executable instructions that when executed by a data processing system cause the data processing system to perform a method comprising:
    training an encoder to generate encoded outputs, in a latent space, from a set of inputs representing sets of dielectric materials present within volumes inside a design of a circuit;
    training a set of neural networks to calculate a representation of Green's function to extract capacitance values from conductors in a set of one or more training circuits; and
    storing a machine learning model that includes the trained encoder and the trained set of neural networks.

12. The non-transitory machine readable medium as in claim 11, wherein Green's function values are calculated, at inference time, during a random walk among a set of conductors in a circuit and wherein values of a gradient of the Green's function values are calculated during the random walk.

13. The non-transitory machine readable medium as in claim 12, wherein the trained encoder encodes characteristics of dielectric permittivity values present within volumes inside the design of the circuit, and wherein a latent space representation from the trained encoder is equivariant to rotation of these volumes.

14. The non-transitory machine readable medium as in claim 13, wherein the neural network for calculation of the gradient of the Green's function values includes a neural network trained for a first axis that is also used for gradient computations in a second axis and a third axis after transformations for the second axis and the third axis in order to reduce a size of the machine learning model.

15. The non-transitory machine readable medium as in claim 14, wherein the trained set of neural networks comprises a first face decoder that generates a first Green's function output for a first face of a volume, and the first face decoder is used with a set of transformations of the latent space representation to generate a set of Green's function outputs for a second face, a third face, a fourth face, a fifth face, and a sixth face of the volume.

16. The non-transitory machine readable medium as in claim 13, wherein the representation of Green's function is a Gaussian mixture model that approximates the Green's function for a selected face of a transition volume.

17. The non-transitory machine readable medium as in claim 16, wherein a trained mixture density neural network in the trained set of neural networks infers parameters of the Gaussian mixture model to approximate the Green's function on the selected face.

18. The non-transitory machine readable medium as in claim 17, wherein the inferred parameters of the Gaussian mixture model are used to pick random samples from an approximation of the Green's function for the selected face.

19. The non-transitory machine readable medium as in claim 18, wherein a trained face selector neural network receives the latent space representation and generates a face distribution from which a face is selected, and the latent space representation is transformed based on the selected face and applied as an input to the trained mixture density neural network.

20. The non-transitory machine readable medium as in claim 19, wherein a gradient output is calculated only once over a path of the random walk.

21. The non-transitory machine readable medium as in claim 13, wherein the encoder is trained as an autoencoder and is trained separately from the set of neural networks that calculate a representation of Green's function.

22. A system comprising:
a memory storing instructions; and
one or more processors coupled to the memory, the one or more processors executing the instructions from the memory to perform a method comprising:
storing a machine learning model that includes a trained set of one or more neural networks that have been trained for calculations of a Green's function;
applying, to the machine learning model, a set of inputs representing a set of dielectric materials present within volumes inside a design of a circuit;
encoding the set of inputs through a trained encoder in the one or more neural networks to generate a latent space representation as an encoding of permittivity values of the set of inputs;
calculating the Green's function of the set of inputs from the latent space representation through one of the one or more neural networks; and
calculating a gradient of the Green's function based on the set of inputs from the latent space representation through the one or more neural networks.

* * * * *